US010282923B2

(12) United States Patent
Tieman

(10) Patent No.: US 10,282,923 B2
(45) Date of Patent: *May 7, 2019

(54) CONNECTED VEHICLE SYSTEM WITH INFOTAINMENT INTERFACE FOR MOBILE DEVICES

(71) Applicant: Craig A. Tieman, Westfield, IN (US)

(72) Inventor: Craig A. Tieman, Westfield, IN (US)

(*) Notice: Subject to any disclaimer, the term of this patent is extended or adjusted under 35 U.S.C. 154(b) by 0 days.

This patent is subject to a terminal disclaimer.

(21) Appl. No.: 15/195,113

(22) Filed: Jun. 28, 2016

(65) Prior Publication Data

US 2016/0350984 A1     Dec. 1, 2016

Related U.S. Application Data

(63) Continuation-in-part of application No. 14/585,557, filed on Dec. 30, 2014, now Pat. No. 9,953,471.

(Continued)

(51) Int. Cl.

| | |
|---|---|
| *G07C 5/02* | (2006.01) |
| *G07C 5/08* | (2006.01) |
| *G07C 5/00* | (2006.01) |
| *G06Q 30/02* | (2012.01) |
| *G01M 17/00* | (2006.01) |

(Continued)

(52) U.S. Cl.
CPC ............ *G07C 5/02* (2013.01); *G07C 5/008* (2013.01); *G07C 5/08* (2013.01); *G07C 5/0833* (2013.01); *B60Q 1/00* (2013.01); *G01M 17/00* (2013.01); *G01R 31/00* (2013.01); *G06F 7/00* (2013.01); *G06Q 30/02* (2013.01); *G07C 5/00* (2013.01); *G07C 5/0825* (2013.01); *H04W 8/24* (2013.01)

(58) Field of Classification Search
CPC .... G06Q 30/0238; G06Q 40/08; G06Q 40/00; G07C 5/0808; G07C 5/008; G07C 5/0825; G07C 5/02; G07C 5/08; G07C 5/0833; G01R 31/006; B60K 35/00; B60K 37/02; H04B 1/082; H04B 1/08; H04W 4/008; H04W 8/24; H04M 1/725; H04M 1/72577; H04M 1/6083; H04M 1/6091; H04M 1/60; G01D 7/02; G01P 1/08

See application file for complete search history.

(56) References Cited

U.S. PATENT DOCUMENTS

| | | | |
|---|---|---|---|
| 6,529,808 B1* | 3/2003 | Diem | G01R 31/006 701/31.5 |
| 2004/0204159 A1* | 10/2004 | Van Bosch | H04B 1/082 455/569.1 |

(Continued)

*Primary Examiner* — Behrang Badii
(74) *Attorney, Agent, or Firm* — Andrus Intellectual Property Law, LLP

(57) ABSTRACT

An OBD module for communicating with a vehicle radio/infotainment system. The OBD module includes a controller, a data bus interface that is configured to draw power from and electronically communicate with a vehicle OBD-II data port and a digital interface connector. The OBD module can be formed from two separate components, including a transceiver module and an interface module, that are in communication with each other. The transceiver module can be located remotely from the interface module. The OBD module can include a graphic equalizer to enhance the sound quality of the input source. The OBD module can also be configured to interrupt playback to play a substitute message as is desired.

6 Claims, 35 Drawing Sheets

Related U.S. Application Data

(60) Provisional application No. 62/186,322, filed on Jun. 29, 2015.

(51) Int. Cl.
  *H04W 8/24* (2009.01)
  *G01R 31/00* (2006.01)
  *G06F 7/00* (2006.01)
  *B60Q 1/00* (2006.01)

(56) References Cited

U.S. PATENT DOCUMENTS

| | | | |
|---|---|---|---|
| 2006/0017552 A1* | 1/2006 | Andreasen | B60K 35/00 340/438 |
| 2009/0112394 A1* | 4/2009 | Lepejian | G07C 5/0808 701/29.5 |
| 2011/0153367 A1* | 6/2011 | Amigo | G06Q 40/08 705/4 |
| 2014/0089078 A1* | 3/2014 | Dessert | G06Q 30/0238 705/14.38 |
| 2014/0106734 A1* | 4/2014 | Lee | H04W 4/80 455/419 |
| 2014/0213238 A1* | 7/2014 | Giraud | G07C 5/008 455/418 |

* cited by examiner

OBD2 Pinout

Pin 1  - NC
Pin 2  - Bus+ (J1850)
Pin 3  - NC
Pin 4  - GND (Chassis)
Pin 5  - GND (Signal)
Pin 6  - CAN High (J-2284)
Pin 7  - K-Line (ISO9141-2)
Pin 8  - NC
Pin 9  - NC
Pin 10 - Bus (J1850)
Pin 11 - NC
Pin 12 - NC
Pin 13 - NC
Pin 14 - CAN Low (J-2284)
Pin 15 - L-Line (ISO9141-2)
Pin 16 - Board Power 12V+

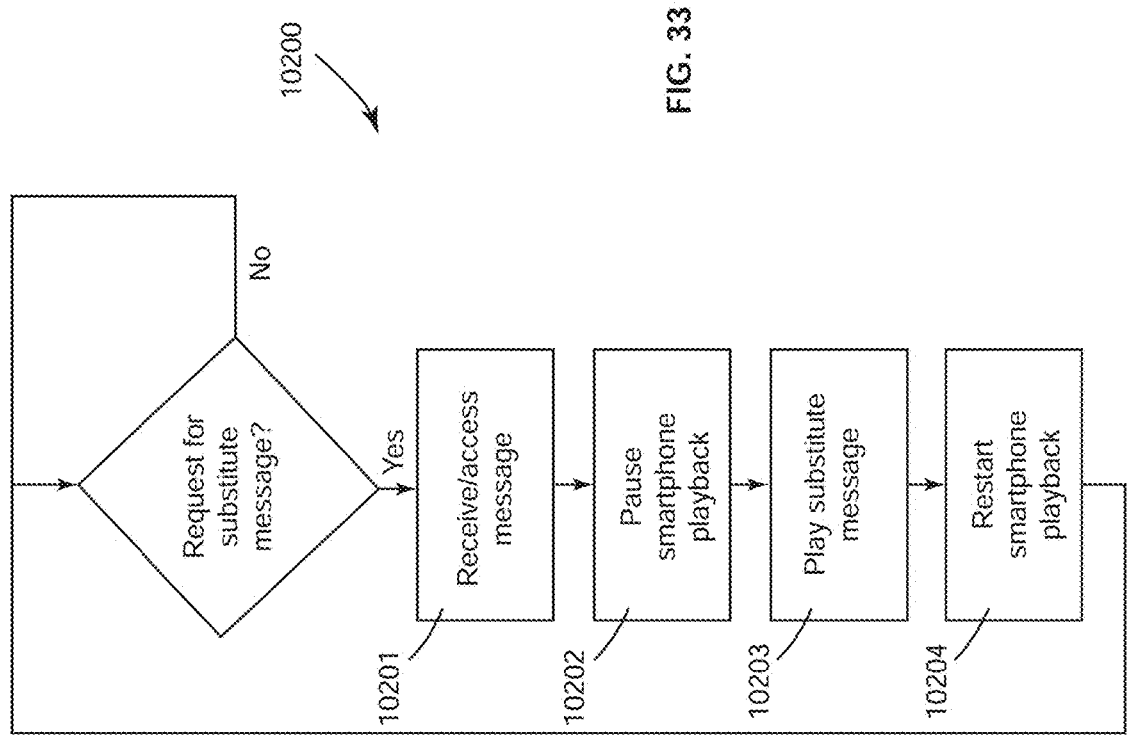

CONNECTED VEHICLE SYSTEM WITH INFOTAINMENT INTERFACE FOR MOBILE DEVICES

CROSS-REFERENCE TO RELATED APPLICATIONS

This application is a continuation-in-part (CIP) of U.S. patent application Ser. No. 14/585,557, filed Dec. 30, 2014, the entire contents of which are hereby incorporated by reference, which in turn claims priority under 35 U.S.C. § 119(e) to the U.S. provisional application Ser. No. 61/921,576 entitled "CONNECTED VEHICLE SYSTEM WITH INFOTAINMENT INTERFACE FOR MOBILE DEVICES," filed on Dec. 30, 2013, the entire contents of which are hereby incorporated by reference; and to the U.S. provisional application Ser. No. 61/942,399 entitled "CONNECTED VEHICLE SYSTEM WITH INFOTAINMENT INTERFACE FOR MOBILE DEVICES," filed on Feb. 20, 2014, the entire contents of which are hereby incorporated by reference. The present application also claims priority to U.S. Provisional Patent Application Ser. No. 62/186,332, filed on Jun. 29, 2015, the disclosure of which is incorporated herein by reference.

FIELD

The present application relates to mobile device-to-vehicle connectivity, specifically to wireless connectivity enhancements of a singular design with automatic FM station recall which can be added to all existing vehicle systems without special tools or training to permit mobile devices to link to any vehicle's existing data bus and radio/infotainment system.

BACKGROUND

Electronic systems in automotive vehicles provide numerous functions related to the normal starting and driving operation, convenience, entertainment, access and security for vehicles. Vehicle manufacturers are introducing vehicles with increasing numbers of features that enhance convenience, entertainment, access and security. Notable advancements include vehicle-to-internet connectivity and mobile device-to-infotainment system connectivity that is accomplished through mobile device connecting via RF (i.e. Bluetooth or Wi-Fi), audio line output or USB or HDMI connectivity. Most vehicle electronic systems in vehicles sold prior to 2010 lack most or all of these connectivity options. In addition, vehicles manufactured with wireless mobile device connectivity features often are rendered nonfunctional due to new mobile devices that are not supported by the vehicle's infotainment system.

The rapid and widespread growth in long-range wireless connectivity and sophisticated hand-held mobile devices with touch-type graphical user interfaces and short or long-range wireless connectivity has led to the proliferation of machine-to-machine connectivity solutions and "anywhere-at-any-time" device interactivity. Consumers generally expect all of their vehicles, homes and devices to be connected and able to be interacted with via their mobile technology from anywhere and at any time.

An increasing number of new vehicles come equipped with built-in wireless connectivity that enables connectivity to these vehicles via mobile devices and web-enabled devices for remote function actuation. Such new vehicles may also have advanced radio/infotainment systems with mobile device wireless connectivity features that provide desirable consumer features. A new vehicle purchase is required, however, to gain access to these features, thus creating high economic barrier to the advanced features.

Aftermarket vehicle electronics suppliers have been offering retrofittable systems to add useful telematics and infotainment system capabilities to older vehicles. The primary limitations of these systems include the need for extensive custom engineering efforts by the suppliers for each vehicle to work with the unique electronics of the vehicles as well as the need for consumers to purchase complete infotainment or security/access systems and pay a professional technician for all installation efforts due to the technical complexity of the different vehicle installations. Consequently, these installations are generally expensive for consumers to consider.

Suppliers of self-installed aftermarket infotainment system upgrades offer dedicated mobile device connectivity via RF broadcast, but they require manual tuning efforts by the user each time the vehicle has been moved to a different location where strong transmitters may already exist. They also take up valuable space within the vehicle center console area.

More recently, suppliers of aftermarket vehicle electronics have introduced systems for consumers to self-install at low-cost and complexity. Delphi Automotive, for example, has recently introduced a system which can be plugged into a standardized on-board diagnostics (OBD-II) connector, which connector is included on all lightduty vehicles since 1996. After downloading a smartphone app, an owner can within a few minutes can have remote control of vehicle access functions from the owner's smartphone or a web-enabled device. Many features are being offered with these plug-in systems, however, none of them have provided an integration with existing vehicle radio/infotainment systems.

Thus, there is a need for after-market improvements to older vehicles which include interfaces that are not readily paired with modern smartphone or wireless radiofrequency technology.

BRIEF SUMMARY

The presently disclosed embodiments, as well as features and aspects thereof, are directed towards an OBD-II module including a data bus interface configured to draw power from and electronically communicate with a vehicle OBD-II data port; and a digital interface connector. The OBD-II module may include one or more of the following features: a processor, a digital interface, a microphone input connector, an audio line output socket, and a control/display/microphone connector. The OBD-II connector may also include one or more long-range and/or short-range radiofrequency transceivers.

The disclosure is also directed toward a radio/infotainment interface device including a digital interface configured to interface with a OBD-II digital interface, an audio line output connector, a vehicle radio digital interface connector, an FM output connector, and an FM input connector.

The disclosure is also directed to a system for interfacing with a vehicle radio/infotainment system that includes an OBD module comprising a controller, a data bus interface configured to draw power from and electronically communicate with a vehicle OBD data port; and a digital interface connector.

The disclosure is also directed to a radio/infotainment interface device comprising a digital interface configured to be in hardwired electronic communication with an OBD module digital interface connector of an OBD module comprising: a controller; a data bus interface configured to draw power from and electronically communicate with a vehicle OBD-II data port; and the OBD module digital interface connector.

BRIEF DESCRIPTION OF THE SEVERAL VIEWS OF THE DRAWING

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 33 is a flowchart of a process to interrupt a smartphone audio/video feed to a radio/infotainment device and substitute a message upon interruption.

DETAILED DESCRIPTION

Figure 1:
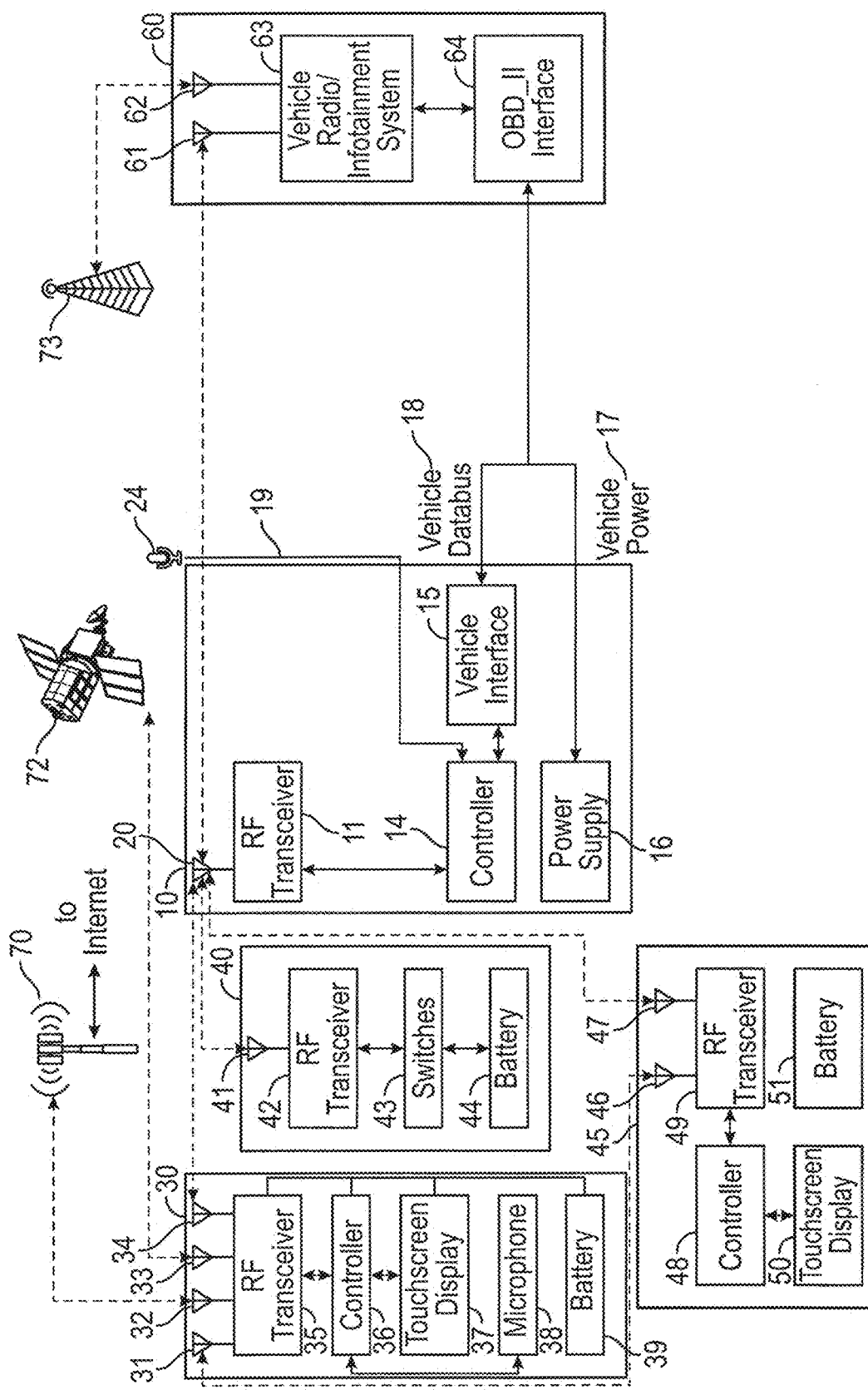
FIG. 1 is a schematic diagram showing the components of the connected vehicle system with an infotainment interface for mobile devices.

Aspects, features and advantages of several exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute terms such as, for example, "will," "will not," "shall," "shall not," "must" and "must not" are not meant to limit the scope of the present invention as the embodiments disclosed herein are merely exemplary.

The word "exemplary" is used herein to mean "serving as an example, instance, or illustration." Any aspect described herein as "exemplary" is not necessarily to be construed as exclusive, preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content," as referred to herein, may also include files that are not executable in nature, such as documents that may need to be opened or other data files that need to be accessed.

As used in this description, the terms "component," "database," "module," "system," "thermal energy generating component," "processing component" and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone," "wireless communication device" and "wireless handset" are used interchangeably. With the advent of third generation ("3G") and fourth generation ("4G") wireless technology, greater bandwidth availability has enabled more portable computing devices with a greater variety of wireless capabilities.

The term "connect" or "connecting" means, unless otherwise specified, functional or operable electronic communication by wired or wireless connection using, for example, an application and/or content and/or a component. In the accompanying figures, a dashed arrow generally means operable wireless electronic communication and a straight arrow generally means operable wired electronic communication.

In this description, the terms "workload," "process load" and "process workload" are used interchangeably and generally directed toward the processing burden, or percentage of processing burden, associated with a given processing component in a given embodiment. Further to that which is defined above, a "processing component" or "thermal energy generating component" may be, but is not limited to, a central processing unit, a graphical processing unit, a core, a main core, a subcore, a processing area, a hardware engine, etc. or any component residing within, or external to, an integrated circuit within a portable computing device. Moreover, to the extent that the terms "thermal load," "thermal distribution," "thermal signature," "thermal processing load" and the like are indicative of workload burdens that may be running on a processing component, one of ordinary skill in the art will acknowledge that use of these "thermal" terms in the present disclosure may be related to process load distributions and burdens.

In this description, the term "portable computing device" ("PCD") is used to describe any device operating on a limited capacity power supply, such as a battery. Although battery operated PCDs have been in use for decades, technological advances in rechargeable batteries coupled with the advent of third generation ("3G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop computer with a wireless connection, among others.

Figure 15A:
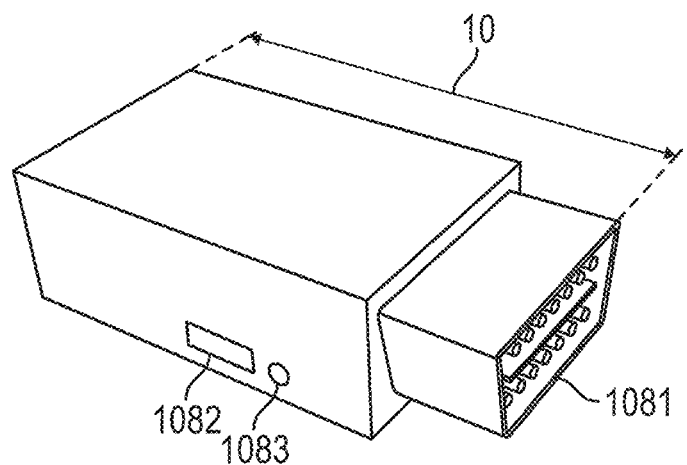
FIG. 15A is an isometric view of the ODB module of FIGS. 1-6 and 9.
Figure 15B:
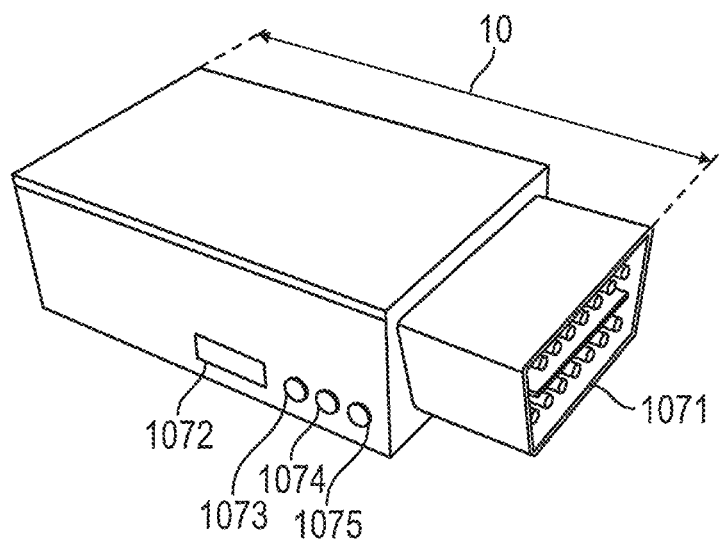
FIG. 15B is an isometric view of the ODB module of FIGS. 7, 8, and 10-14.
Figure 15C:
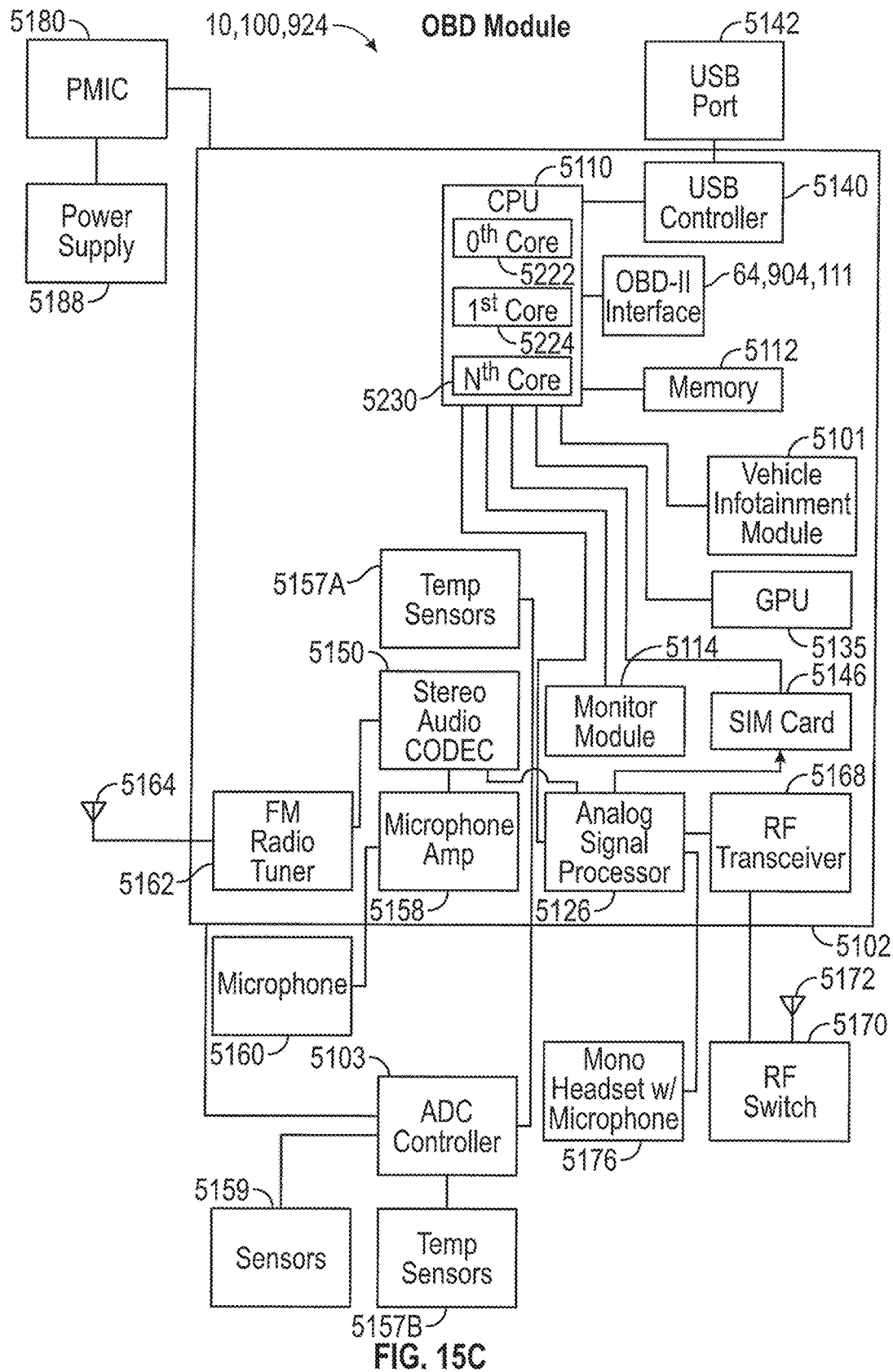
FIG. 15C is a schematic diagram showing the components of an exemplary ODB module of FIGS. 15A and 15B.

In an embodiment, with reference to FIGS. 15A, 15B and 15C, the OBD-II module 10 comprises a plug-in OBD-II connector for power and access to vehicle data bus information. FIG. 15A shows an OBD module 10 which has an OBD-II compatible interface connector 1081, a USB socket 1082, and microphone input socket 1083. FIG. 15B shows OBD module 10 which has an OBD-II compatible vehicle interface connector 1071, a USB socket 1072, an audio line input socket 1073, an audio line output socket 1074 and a control/display/microphone socket 1075.

Figure 22:
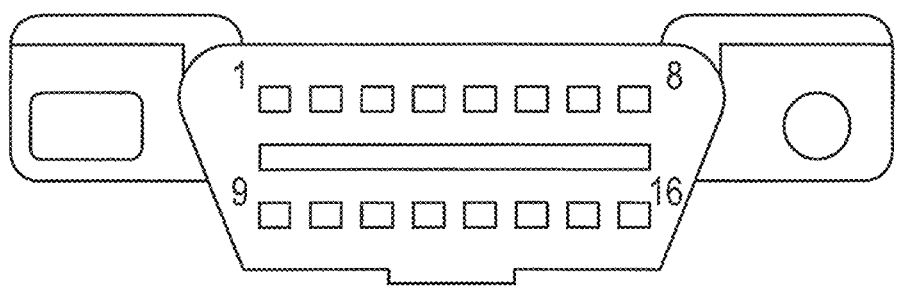
FIG. 22 is a schematic of an OBD-II pinout configuration.

With reference to FIG. 15A and FIG. 15B, an OBD module comprises one or more radio frequency (RF) transceiver modules for short, medium and long-range communication with mobile devices either directly or via cellular links to the internet which extends the communication path to those mobile devices and to other services on the internet. A short-range RF connection to a mobile device may include a Bluetooth, Wi-Fi or an equivalent short-range RF module for linking to a mobile device, thus permitting the use of phone features such as hands-free calling, wireless audio/video streaming and navigation system outputs to the radio/infotainment system. The OBD module could include one or more 3-axis accelerometer modules for measuring vehicle accelerations and a temperature sensor for measuring vehicle interior temperature. In another embodiment, the ODB module may include automatically detecting a vehicle start and stop using battery voltage from, e.g., Pin 16 connector as shown in FIG. 22; that is, for example, gathering engine performance data; and enabling manual and/or automatic engine start-up and engine shut-down programs. Any other type of vehicle data could also be transmitted to the mobile device or electronically connected internet servers via the RF transceivers. The OBD module include a charge voltage output module e.g., port, for connecting to a mobile device.

FIG. 15C is a functional block diagram illustrating an exemplary, non-limiting aspect of an OBD Module ("OBDM") 10/100/924. As shown, the OBDM 10/100/924 includes an on-chip system 5102 that includes a multi-core central processing unit ("CPU") 5110 and an analog signal processor 5126 that are coupled together. The CPU 5110 may comprise a zeroth core 5222, a first core 5224, and an Nth core 5230 as understood by one of ordinary skill in the art. Further, instead of a CPU 5110, a digital signal processor ("DSP") may also be employed as understood by one of ordinary skill in the art.

As illustrated in FIG. 15C a universal serial bus ("USB") controller 5140 is coupled to the CPU 5110. Also, a USB port 5142 is coupled to the USB controller 5140. A memory 5112, which may include a PoP memory, a cache, a mask ROM/Boot ROM, a boot OTP memory, a DDR memory, may also be coupled to the CPU 5110. A subscriber identity module ("SIM") card 5146 may also be coupled to the CPU 5110.

As further illustrated in FIG. 15C, a stereo audio CODEC 5150 may be coupled to the analog signal processor 5126. A microphone amplifier 5158 may be also coupled to the stereo audio CODEC 5150. Additionally, a microphone 5160 may be coupled to the microphone amplifier 5158. In a particular aspect, a frequency modulation ("FM") radio tuner 5162 may be coupled to the stereo audio CODEC 5150. Also, an FM antenna 5164 is coupled to the FM radio tuner 5162.

FIG. 15C further indicates that a radio frequency ("RF") transceiver 5168 may be coupled to the analog signal processor 5126. An RF switch 5170 may be coupled to the RF transceiver 5168 and an RF antenna 5172. Also, a mono headset with a microphone 5176 may be coupled to the analog signal processor 5126. FIG. 15C also shows that a power supply 5188, for example a battery, is coupled to the onchip system 5102 through a power management integrated circuit ("PMIC") 5180. In a particular aspect, the power supply 5188 includes a rechargeable DC battery or a DC power supply that is derived from an alternating current ("AC") to DC transformer that is connected to an AC power source. In another particular aspect, the power supply 5188 includes a kinetically rechargeable DC battery.

The CPU 5110 may also be coupled to one or more internal, on-chip thermal sensors 5157A as well as one or more external, off-chip thermal sensors 5157B and other sensors 5159. The on-chip thermal sensors 5157A may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The offchip thermal sensors 5157B may comprise one or more thermistors. The thermal sensors 5157 may produce a voltage drop that is converted to digital signals with an analog-to-digital converter ("ADC") controller (not shown).

The microphone 5160, the FM antenna 5164, the RF switch 5170, the RF antenna 5172, the mono headset 5176, thermal sensors 5157B, other sensors 5159, the PMIC 5180 and the power supply 5188 are external to the on-chip system 5102. It will be understood, however, that one or more of these devices depicted as external to the on-chip system 5102 in the exemplary embodiment of a OBDM 10/100/924 in FIG. 15C may reside on chip 5102 in other exemplary embodiments.

Figure 16A:
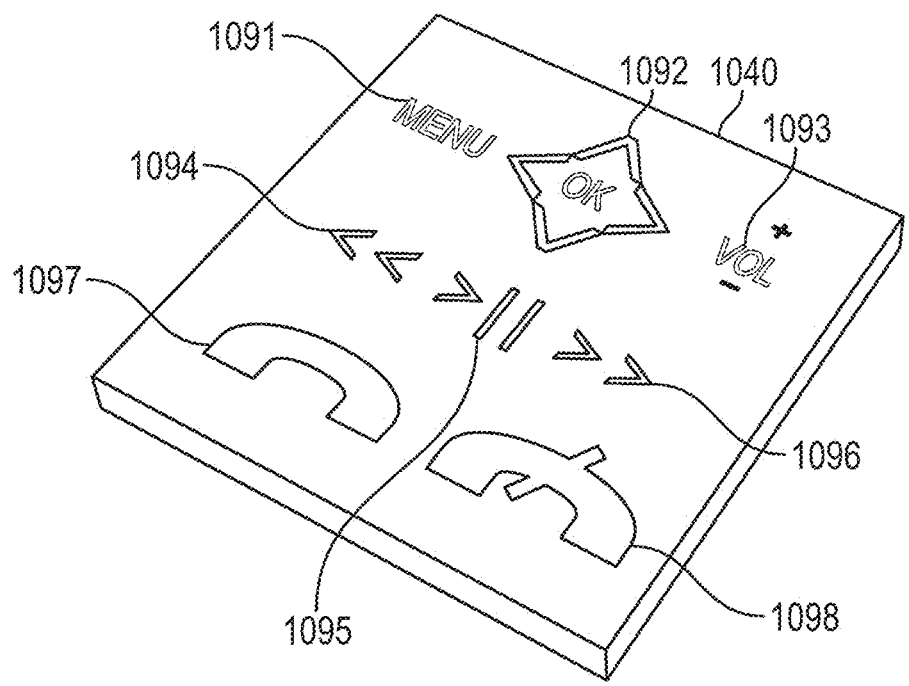
FIG. 16A is an isometric view of the control switch module of FIGS. 7-8.
Figure 16A:
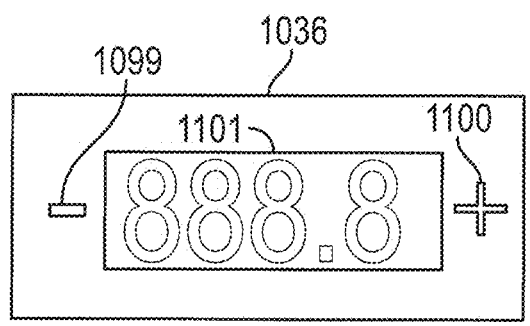

In an embodiment, the OBD module includes a low power RF wireless interface to a separate battery-powered steering wheel-mounted switch panel e.g., the switch panel as shown in FIG. 16A. FIG. 16A shows an exemplary control switch module 1040 with a menu button 1091, up/down/left/right/ OK buttons 1092, volume up and down buttons 1093, a seek back button 1094, a pause/play button 1095, a seek forward button 1096, a call button 1097 and a hang-up button 1098. Accompanying display module 1036, visible to a vehicle passenger or driver, includes a tune down button 1099, a display 1101 and a tune up button 1100 that may be associated with control switch module 1040. In this manner, the driver has a radio/infotainment interface for communicating audio and, optionally, video information to the vehicle's existing radio/infotainment system or a vehicle mounted large screen touchscreen tablet.

Different configurations of the system are shown, ranging from basic Bluetooth and OBD interfaces to the addition of a radio/infotainment interface module, Wi-Fi, GPS and cellular radios. The possible interfaces include: Bluetooth, Wi-Fi, FM radio broadcast, audio line level, digital interface (e.g. USB, HDMI, etc.) and via the OBD-II interface. The control/microphone module 1040 could be self-powered with a battery and connected to OBD module 10 via short-range RF link to a short range antenna and designed to mount anywhere in reach of the driver, including on the steering wheel on or adjacent to existing steering wheel controls. The display module 1036 could be combined with a control/microphone module, e.g., microphone 24 in FIGS. 1-6, microphone module 75 in FIGS. 7-8, and microphone 916 in FIGS. 9-14.

Figure 16B:
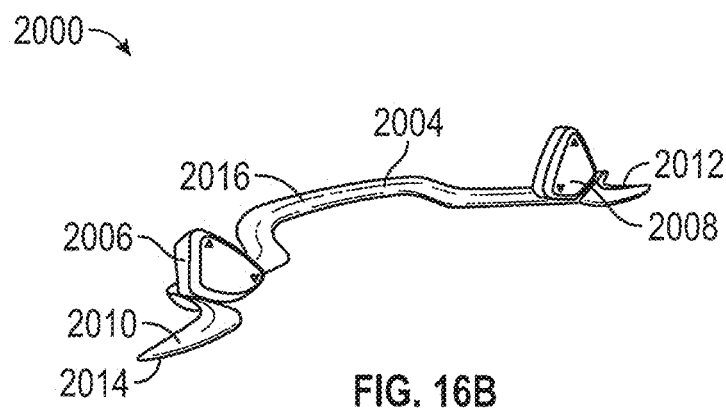
FIG. 16B is an isometric view of a steering-wheel mountable control switch module.
Figure 16C:
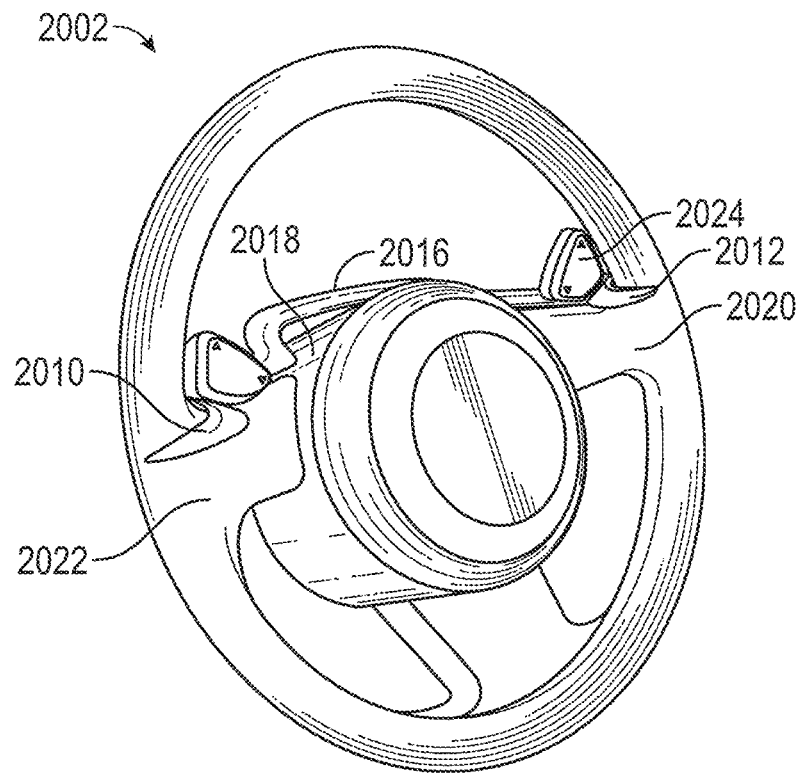
FIG. 16C is an isometric view of the module of FIG. 16B mounted on an automobile steering wheel.

With reference to FIG. 16B and FIG. 16C, in an embodiment, a multi-button control panel 2000 may be mounted on wheel 2002. Individual switch modules 2006 and 2008 may be mounted at or toward separate ends of curvilinear body 2004. Body 2004 and/or switch modules 2006 and/or 2008 may comprise radiofrequency and/or controller modules to communicate with OBD module 10 and/or smartphone 30, for example. Body 2004 may comprise, for example a battery compartment to receive batteries to therefore power the switch modules 2006 and 2008.

Body 2004 may comprise a shaped resilient material capable of flexing to hold body 2004 on wheel 2002. For example, body 2004 may define curved region 2010 between switch module 2006 and end 2014; and body 2004 may define curved region 2012 between switch module 2008 and end 2012. Resilient central region 2016 urges curved regions 2010 and 2012 toward internal surface 2024. Ends 2012 and 2014 overlie spokes 2022 and 2020, respectively, to secure body 2004 diametrically inside wheel 2002. Resilient central region 2016 contacts hub 2018, thus stabilizing the placement of the module 2000 on wheel 2002.

In an embodiment, FIG. 1 shows a schematic of an RF, e.g., Bluetooth-only, OBD module that interfaces with a vehicle's radio/infotainment system. With reference to FIG. 1 and FIG. 15A/15B, ODB module 10 includes an RF transceiver 11 with short-range antenna 20 for connecting, e.g., at close range, with mobile device 30, short-range antenna 61, control switch module 40 and tablet display 45. The shortrange RF transmission method may be, e.g., Bluetooth® or Wi-Fi®. The RF transceiver 11 connects to a controller 14 that receives audio information 19 from microphone 24. The controller 14 connects to a vehicle interface 15 and is powered by power supply 16.

In an embodiment, with reference to FIG. 1, FIG. 2, FIG. 3, FIG. 4, FIG. 5, and FIG. 6, the vehicle interface 15 may be connector 1081 in FIG. 15A or connector 1071 in FIG. 15B. In such an embodiment, for example, power supply 16 receives vehicle power 17, e.g., 12 V battery voltage from the vehicle OBD-II interface 64, e.g., shown in FIG. 22 as Pin 16. The vehicle interface 15 also connects to vehicle data bus 18, e.g., via Pin 2 and/or Pin 10, through the vehicle OBD-II interface 64 as shown in FIG. 22.

In another embodiment, with reference to FIG. 1, FIG. 2, FIG. 3, FIG. 4, FIG. 5, and FIG. 6, mobile device 30 includes an RF transceiver 35 with short-range antenna 34 for connecting to short-range antenna 20 and a long-range antenna 32 for connecting with cellular tower antenna 70. Mobile device 30 may include a GPS antenna 33 for receiving information from GPS satellites 72 and short-range antenna 31 for connecting with short range antenna 46. Mobile device 30 includes a controller 36 which connects to a touchscreen display 37, a microphone 38 and a battery 39. Battery 39 typically supplies power to all components of mobile device 30, e.g., controller 36, touchscreen display 37, and microphone 38.

In an embodiment, with reference to FIG. 1, FIG. 2, FIG. 3, FIG. 4, FIG. 5, and FIG. 6, control switch module 40 includes a short-range antenna 41 to communicate with short-range antenna 20, an RF transceiver 42, switches 43 and a battery 44 for power, all of which are in electronic communication. Battery 44 may also be connected directly to RF transceiver 42 (not shown).

In an embodiment, with reference to FIG. 1, FIG. 2, FIG. 3, FIG. 4, FIG. 5, and FIG. 6, a tablet display 45 includes short-range antenna 46 for electronic communication with antenna 31 and/or antenna 20; short range antenna 47 for electronic communication with antenna 20, controller 48, RF transceiver 49, touchscreen display 50 and battery 51 for power. Battery 51 may also be connected directly to controller 48, and/or RF transceiver 49, and/or touchscreen display 50 (not shown).

In an embodiment, with reference to FIG. 1, FIG. 2, FIG. 3, FIG. 4, FIG. 5, FIG. 6, and FIG. 22, Vehicle 60 includes a vehicle OBD-II interface 64 which connects to vehicle battery voltage and internal vehicle electronics systems. Interface 64 connects to a vehicle radio/infotainment system 63 which receives FM radio broadcasts from an FM broadcast radio tower 73 via vehicle radio antenna 62 and mobile device transmissions via short range antenna 61.

Figure 2:
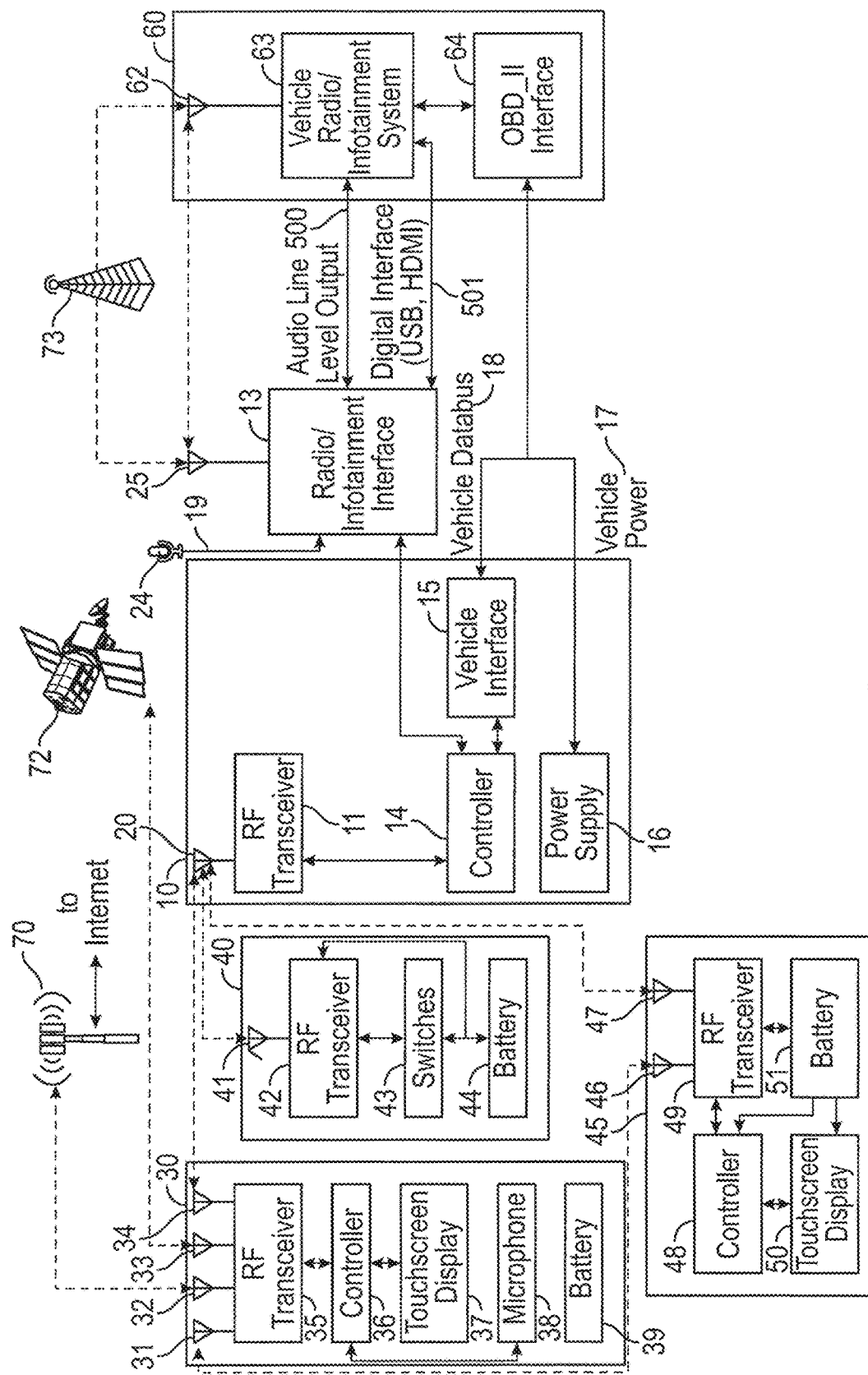
FIG. 2 is a second schematic diagram showing the components of the connected vehicle system with an infotainment interface for mobile devices.
Figure 17:
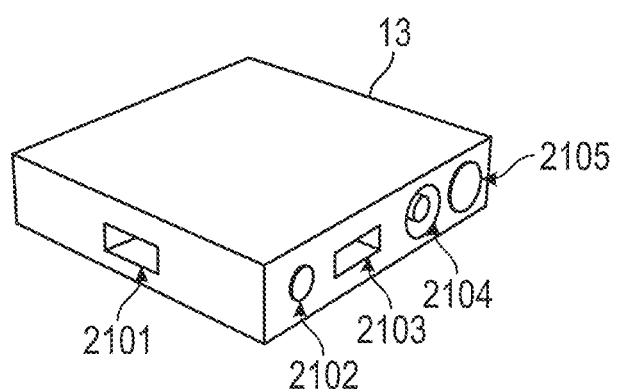
FIG. 17 is an isometric view of the radio/infotainment interface of FIGS. 2, 3, 4, 5, 6, 7, 8, 10, 11, 12, 13, and 14.

In another embodiment, FIG. 2 shows a schematic of an RF, e.g., a Bluetooth-only, OBD module that connects to a radio/infotainment interface 13 with multiple outputs for interfacing to a vehicle radio/infotainment system 63 (i.e. FM broadcast, USB or HDMI digital interface or audio line level). Thus, FIG. 2, with reference to FIG. 17, shows a schematic diagram of the connected vehicle system with an infotainment interface for mobile devices. The embodiment includes ODB module 10 including an RF transceiver 11 with short-range antenna 20 for connecting at close range with a mobile device 30, control switch module 40 and tablet display 45. The short-range RF transmission method may be, e.g., Bluetooth® or Wi-Fi®. The RF transceiver 11 may be operably connected to controller 14. The controller 14 is in electronic communication with radio/infotainment interface 13 and vehicle interface 15. The controller is powered by power supply 16 that receives vehicle power 17 e.g., a 12V battery voltage through the vehicle OBD-II interface 64. The vehicle interface 15 is also in electronic communication with a vehicle data bus 18 via the vehicle OBD-II interface 64. The radio/infotainment interface 13 receives audio information 19 from microphone 24; has a long range antenna 25 for receiving from an FM broadcast radio tower 73 and broadcasting to a vehicle radio antenna 62, an audio line level output 500 to send audio information and a digital interface 501, e.g., a USB type or HDMI type interface, to send and receive digital information to and from a vehicle radio/infotainment system 63.

Figure 3:
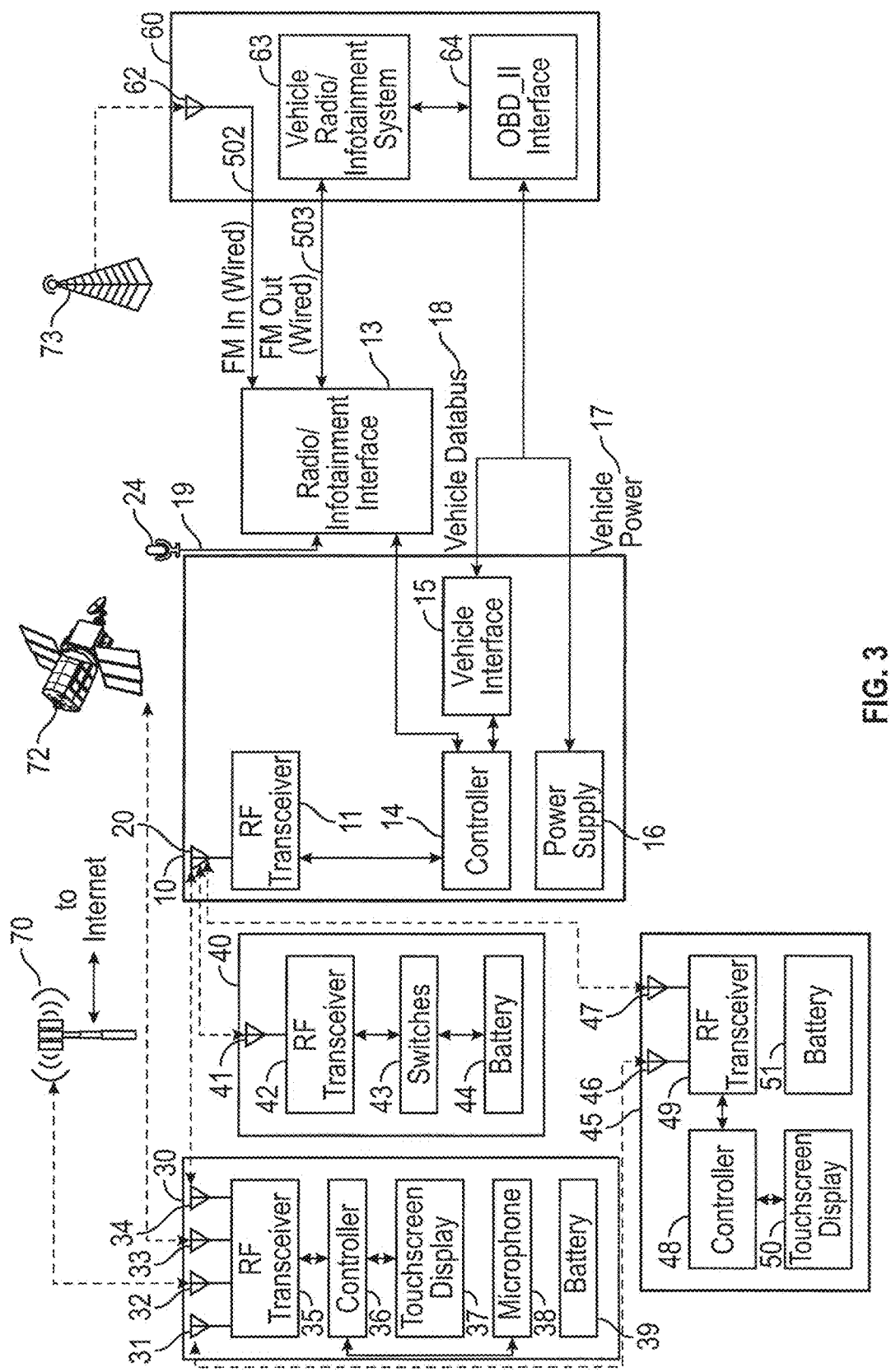
FIG. 3 is a third schematic diagram showing the components of the connected vehicle system with infotainment interface for mobile devices.

In an embodiment, the configurations of FIG. 1, FIG. 2 and FIG. 3 may utilize the mobile device's (30) cellular radio for internet connectivity and GPS receiver (e.g., 33 and RF Transceiver 35) to determine current vehicle location. The tablet device 45, if used, would utilize an RF mode, e.g., Bluetooth for data transfer.

In an embodiment, FIG. 3 describes a configuration similar to that described in FIG. 2 except that the connection from interface 13 to the vehicle radio/infotainment system 63 is a wired FM broadcast. In FIG. 3 a radio antenna connection 502 is routed through radio/infotainment interface 13. Interface 13 may be configured to allow a pass-through of the signal 503 to the vehicle radio/infotainment system 63. Thus, FIG. 3, shows a schematic diagram of the connected vehicle system with infotainment interface for mobile devices wherein the ODB module 10 includes an RF transceiver 11 with short-range antenna 20 for connecting at close range with a mobile device 30, control switch module 40 and tablet display 45. The short-range RF transmission method may be, e.g., Bluetooth® or Wi-Fi®. The RF transceiver 11 connects to controller 14. The controller 14 is in electronic communication with radio/infotainment interface 13 and vehicle interface 15. The ODB module 10 is powered by power supply 16 which receives vehicle power 17, e.g., a 12 V battery voltage from the vehicle OBD-II interface 64. The vehicle interface 15 is also in electronic communication with a vehicle data bus 18 via the vehicle OBD-II interface 64. The radio/infotainment interface 13 receives audio information 19 from microphone 24, has a wired FM-In connector 502 for connecting to vehicle radio antenna 62 and a wired FM-Out connector 503 for connecting to vehicle radio/infotainment system 63.

Figure 4:
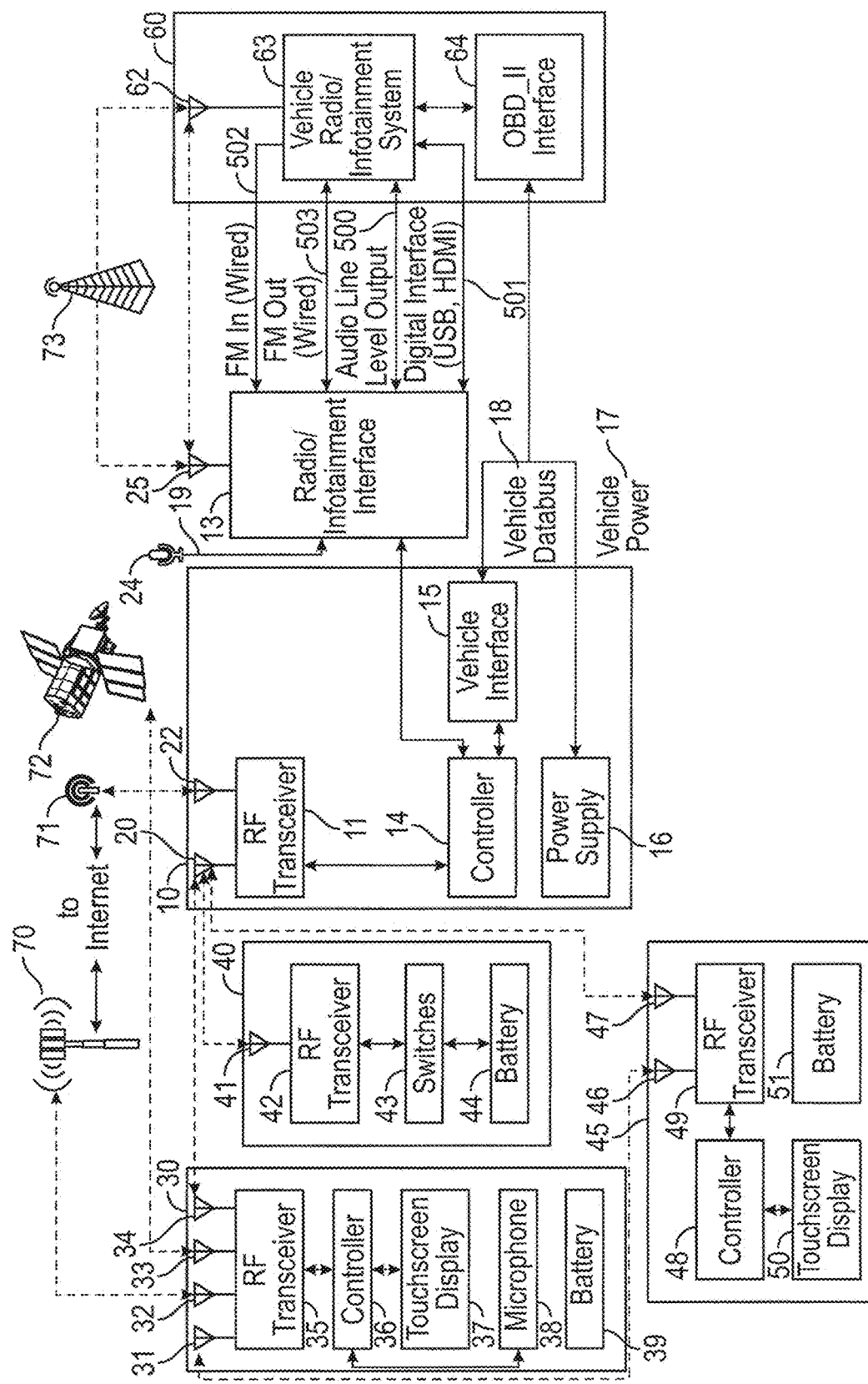
FIG. 4 is a fourth schematic diagram showing the components of the connected vehicle system with infotainment interface for mobile devices.

In another embodiment, FIG. 4 describes a Wi-Fi® and Bluetooth®-only OBD module that obtains internet connectivity via linked mobile phone or local Wi-Fi hotspot and vehicle location from the mobile device's GPS receiver. The tablet device, if used, would utilize Bluetooth® and/or Wi-Fi® for audio/video/data transfer. Thus, FIG. 4, with reference to FIG. 17, is a schematic diagram of the connected vehicle system with infotainment interface for mobile devices. The ODB module 10 includes an RF transceiver 11 with short-range antenna 20 for connecting at close range with a mobile device 30, control switch module 40 and tablet display 45. The ODB module 10 also includes a medium-range antenna 22 for connecting with a local Wi-Fi® access point 71. The short-range RF transmission method is, e.g., Bluetooth® or Wi-Fi®. The RF transceiver 11 connects to controller 14. The controller 14 is in electronic communication with a radio/infotainment interface 13 and with vehicle interface 15. The ODB module 10 is powered by power supply 16 that receives vehicle power 17, e.g., 12 V battery voltage from the vehicle OBD-II interface 64. The vehicle interface 15 also connects to a vehicle data bus 18 via the vehicle OBD-II interface 64. The radio/infotainment interface 13 receives audio information 19 from microphone 24, has a long range antenna 25 for receiving a signal from an FM broadcast radio tower 73 and broadcasting to a vehicle radio antenna 62. The radio/infotainment interface 13 comprises an audio line level output 500 to transmit audio information, a digital interface 501, an FM-In connector 502 for connecting to vehicle radio antenna 62 and an FM-Out connector 503 for connecting to a vehicle radio/infotainment system 63.

Figure 5:
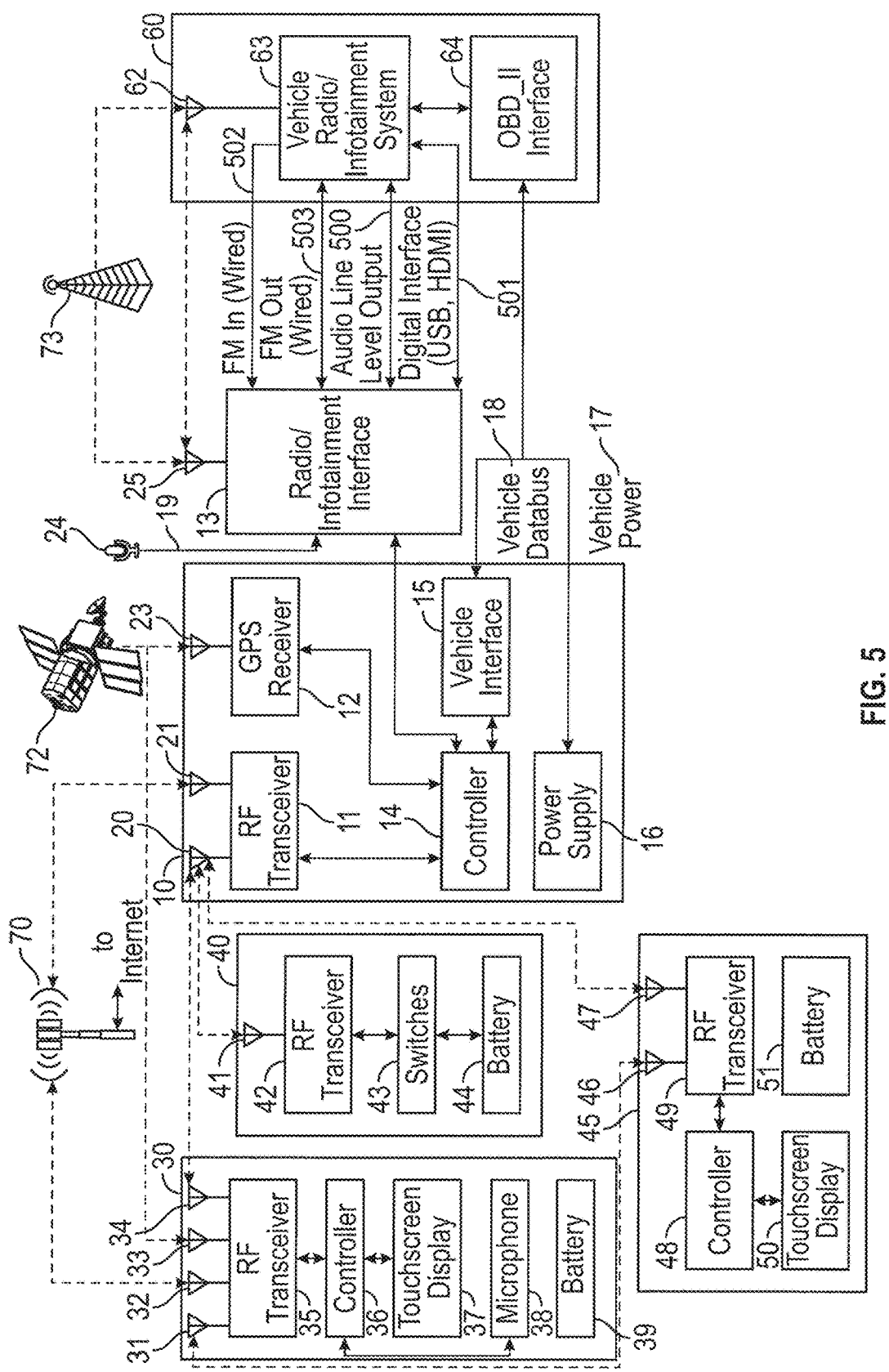
FIG. 5 is a fifth schematic diagram showing the components of the connected vehicle system with infotainment interface for mobile devices.

In another embodiment, FIG. 5 shows an OBD module with Bluetooth®, Wi-Fi®, GPS and cellular radios and a radio/infotainment interface for all possible means of interfacing with the vehicle radio/infotainment system. Linkages to mobile devices and tablet can be via Wi-Fi® and/or Bluetooth®. Thus, FIG. 5, with reference to FIG. 17, is a schematic diagram of the connected vehicle system with infotainment interface for mobile devices. The ODB module 10 has an RF transceiver 11 with short-range antenna 20 for connecting at close range with a mobile device 30, control switch module 40, and tablet display 45. The ODB module 10 has a longrange antenna 21 for connecting with a cellular tower antenna 70. The short-range RF transmission method is, e.g., Bluetooth® or Wi-Fi®. The RF transceiver 11 connects to a controller 14. The controller 14 is in electronic communication with a GPS receiver 12 which receives signals from GPS satellites 72 using GPS antenna 23. The controller 14 is in electronic communication with a radio/infotainment interface 13 and with a vehicle interface 15. The ODB module 10 is powered by power supply 16 that receives vehicle power 17, e.g., 12 V battery voltage from the vehicle OBD-II interface 64. The vehicle interface 15 also connects to the vehicle data bus 18 via the vehicle OBD-II interface 64. The radio/infotainment interface 13 receives audio information 19 from microphone 24, has a long range antenna 25 for receiving a signal from an FM broadcast radio tower 73 and broadcasting a signal to a vehicle radio antenna 62, an audio line level output 500 to send audio information, a digital interface 501, an FM-In connector 502 for connecting to vehicle radio antenna 62 and an FM-Out connector 503 for connecting to a vehicle radio/infotainment system 63.

Figure 6:
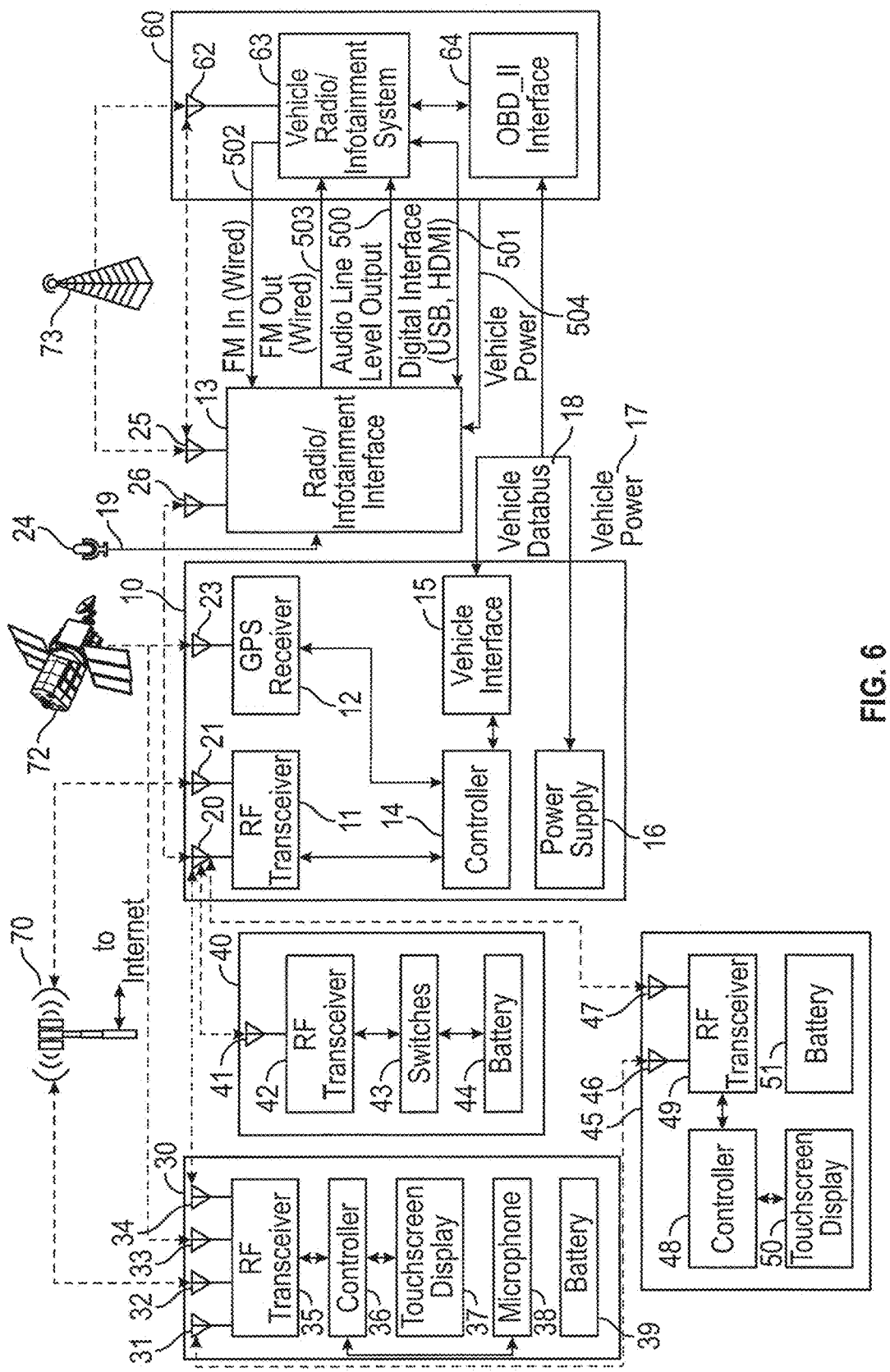
FIG. 6 is a sixth schematic diagram showing the components of the connected vehicle system with infotainment interface for mobile devices.

In another embodiment, FIG. 6 shows the system of FIG. 5 except that radio/infotainment system is powered by a separate vehicle power supply. With this system installed and linked to the user's mobile device, software applications running on the mobile device such as phone, video and audio streaming, etc. could receive their user audio inputs from either the mobile device microphone or the connected vehicle system's microphone as well as direct audio or video output to the vehicle's radio/infotainment system instead of the mobile device's speaker and display. Thus, FIG. 6, with reference to FIG. 17, is a schematic diagram of the connected vehicle system with infotainment interface for mobile devices. The ODB module 10 has an RF transceiver 11 with short-range antenna 20 for connecting at close range with a mobile device 30, short-range antenna 26, control switch module 40 and tablet display 45. The ODB module 10 has a long-range antenna 21 for connecting with a cellular tower antenna 70. The short-range RF transmission method is, e.g., Bluetooth® or Wi-Fi®. The RF transceiver 11 connects to controller 14. The controller 14 is in electronic communication with a GPS receiver 12 which receives signals from GPS satellites 72 using GPS antenna 23. The controller is in electronic communication with a radio/infotainment interface 13 and with a vehicle interface 15. The ODB module 10 is powered by power supply 16 that receives vehicle power 17, e.g., 12 V battery voltage from the vehicle OBD-II interface 64. The vehicle interface 15 also connects to the vehicle data bus 18 via the vehicle OBD-II interface 64. The radio/infotainment interface 13 receives vehicle power 504 separately from a vehicle power connector (not shown). The radio/infotainment interface 13 receives audio information 19 from microphone 24, has a short range antenna 26, a long range antenna 25 for receiving from an FM broadcast radio tower 73 and broadcasting to a vehicle radio antenna 62, an audio line level output 500 to send audio information, a digital interface 501, an FM-In connector 502 for connecting to vehicle radio antenna 62 and an FM-Out connector 503 for connecting to a vehicle radio/infotainment system 63.

Figure 7:
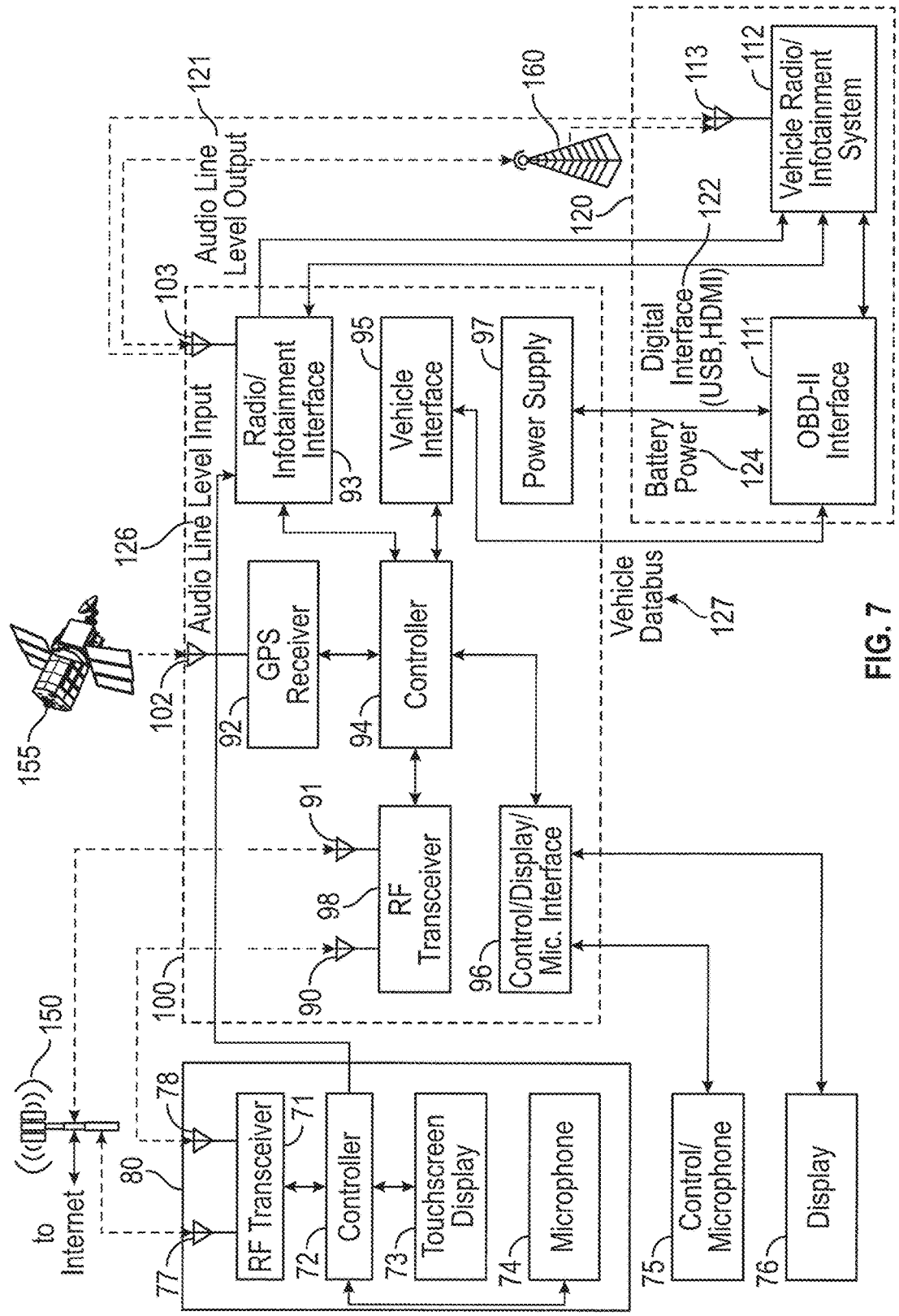
FIG. 7 is a seventh schematic diagram showing the components of the connected vehicle system with infotainment interface for mobile devices.
Figure 8:
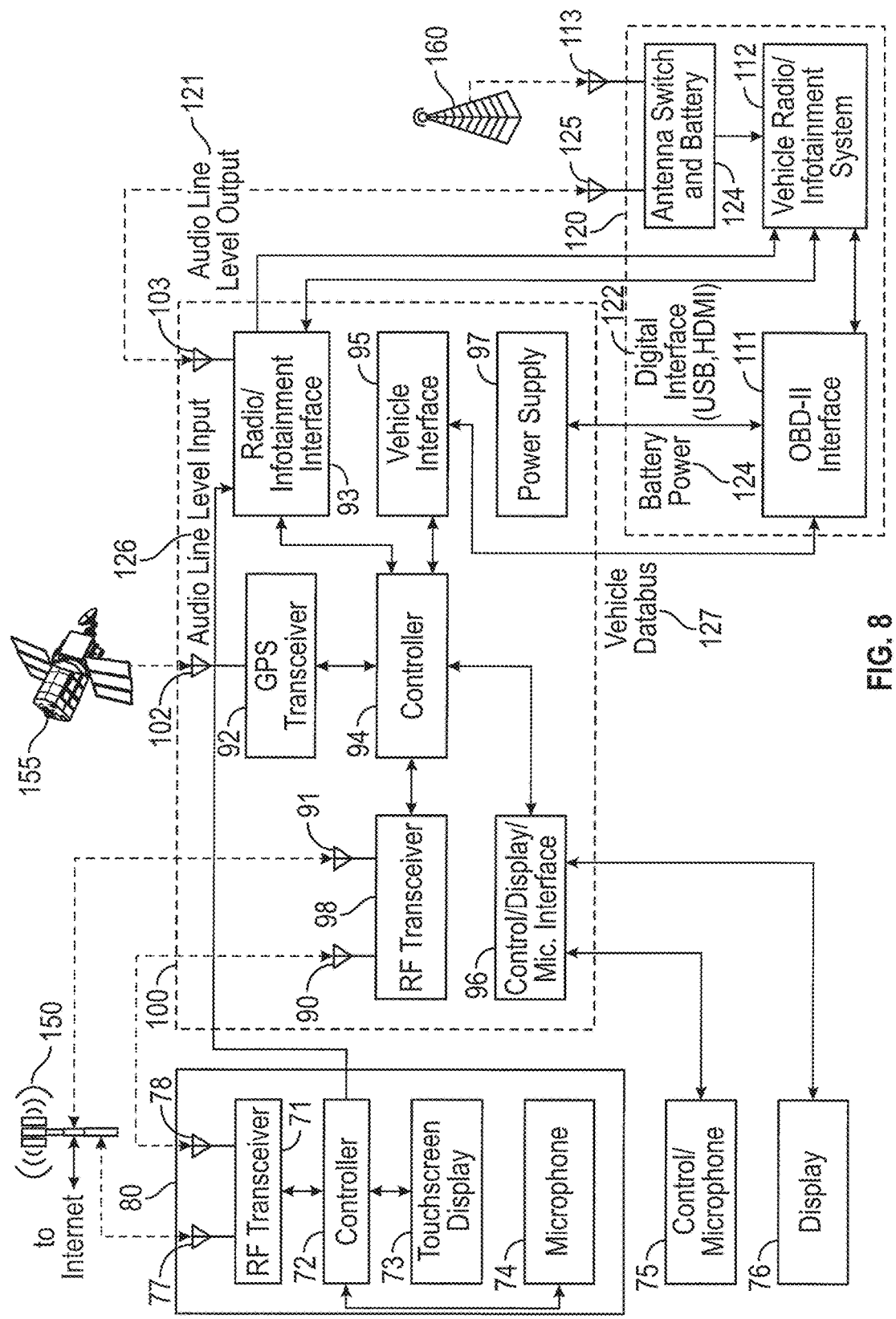
FIG. 8 is a eighth schematic diagram showing the components of the connected vehicle system with infotainment interface.

FIG. 7 and FIG. 8 are schematic diagrams of the connected vehicle system with infotainment interface for mobile devices according to one embodiment. With reference to FIG. 7, the OBD module 100 has an RF transceiver 98 with short-range antenna 90 for connecting at close range with a mobile device 80 and a long-range antenna 91 for connecting with a cellular tower antenna 150. The short-range RF transmission method is, e.g., Bluetooth® or WiFi®. The RF transceiver 98 connects to a controller 94 that connects to a control/display/microphone interface 96. The control/display/microphone interface 96 connects to a control/microphone module 75 and a display module 76. The controller 94 connects to a GPS receiver 92 which receives signals from GPS satellites 155 using GPS antenna 102. The controller 94 connects to a radio/infotainment interface 93 and to a vehicle interface 95. The OBD module 100 is powered by power supply 97 that receives 12 V battery voltage from the vehicle OBD-II interface 111 and monitors battery voltage. The vehicle interface 95 also connects to the vehicle data bus 127 via the vehicle OBD-II interface 111. The radio/infotainment interface 93 has an audio line level input 126 for receiving audio information from a mobile device 80, a radio/infotainment interface antenna 103 for receiving from an FM broadcast radio tower 160 and broadcasting to a vehicle radio antenna 113 (or to an antenna switch 124 with short-range antenna 125 in the embodiment represented in FIG. 8), an audio line level output 121 to send audio information and a digital interface 122 to send/receive digital information to/from a vehicle radio/infotainment system 112.

With reference to FIG. 7 and FIG. 8, mobile device 80 includes an RF transceiver 71 with short-range antenna 78 for connecting to short-range antenna 90 and a long-range antenna 77 for connecting with cellular tower antenna 150. The mobile device will include at least a controller 72 that connects to a touchscreen display 73 and a microphone 74. A battery, or other power supply, not shown, provides energy to the mobile device for operation.

With respect to FIG. 7 and FIG. 8, vehicle 120 has a vehicle OBD-II interface 111 which connects to vehicle battery voltage and internal vehicle electronics systems, e.g., a vehicle radio/infotainment system 112 which receives FM radio broadcasts from an FM broadcast radio tower 160 and the radio/infotainment antenna 103 via vehicle radio antenna 113 directly in one embodiment or via an antenna switch and battery 124 in the embodiment described in FIG. 8.

Figure 9:
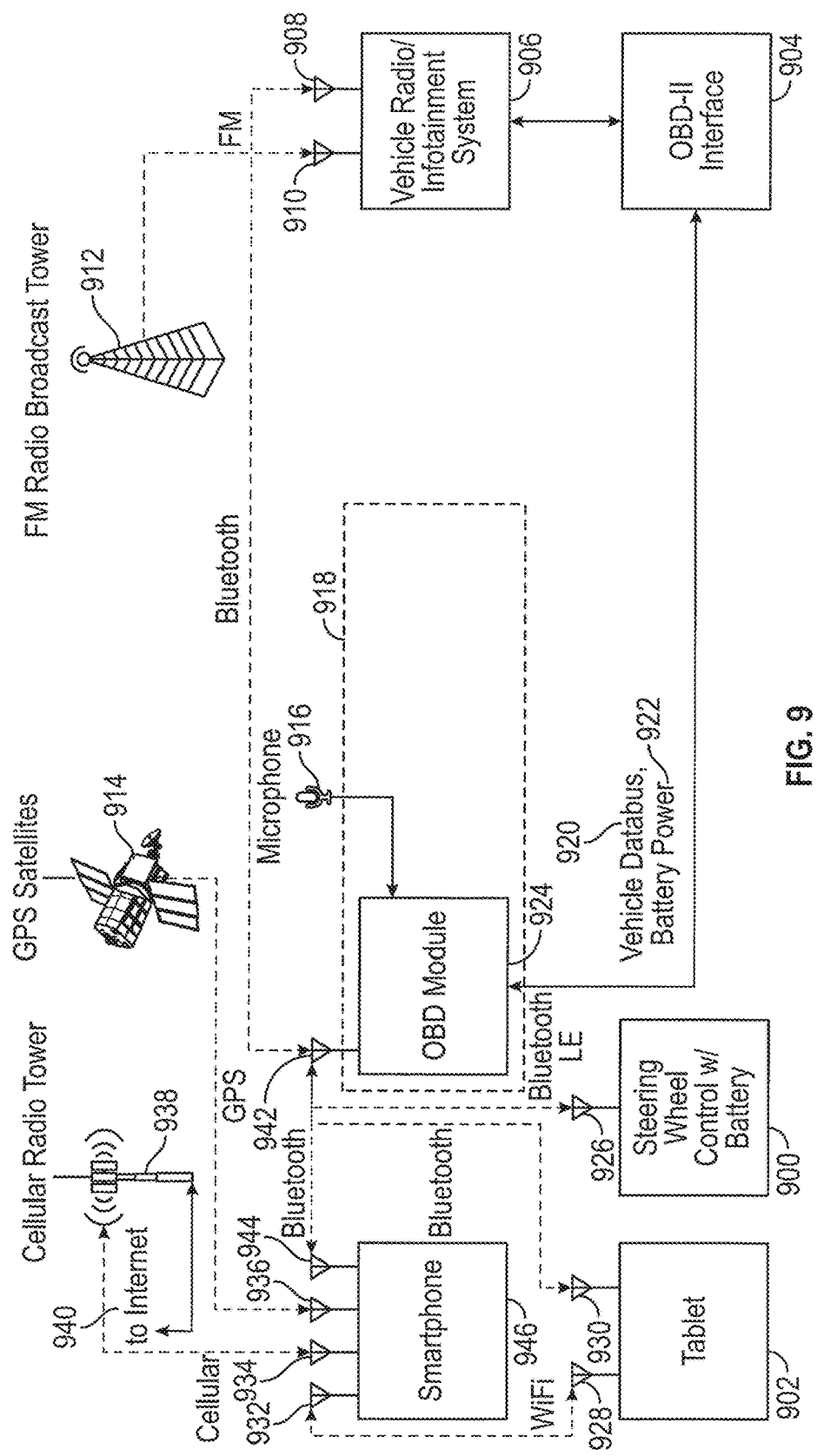
FIG. 9 is a ninth schematic diagram showing the components of the connected vehicle system with infotainment interface.

With reference to FIG. 9, in an exemplary embodiment, interface module 918 includes OBD module 924 that is in electronic communication with vehicle databus 920 and receives battery, or vehicle, power 922 through the OBD-II vehicle interface 904. OBD module 924 receives input from microphone 916 and is in radiofrequency communication, e.g., via Bluetooth® or Bluetooth® LE from antenna 942, with tablet 902, smartphone 946, vehicle radio/infotainment system 906, and steering wheel control 900 using antennas 930, 944, 908, and 926, respectively. Smartphone 946 is in radiofrequency communication, e.g., via WiFi®, with Tablet 902 using antennas 932 and 928 respectively. Smartphone 946 is electronically linked to the internet 940 through cellular tower 938 using antenna 934. Smartphone 946 may also receive GPS signals at antenna 936 from GPS satellites 914. OBD-II interface 904 is also in electronic communication with vehicle radio/infotainment system 906.

Figure 10:
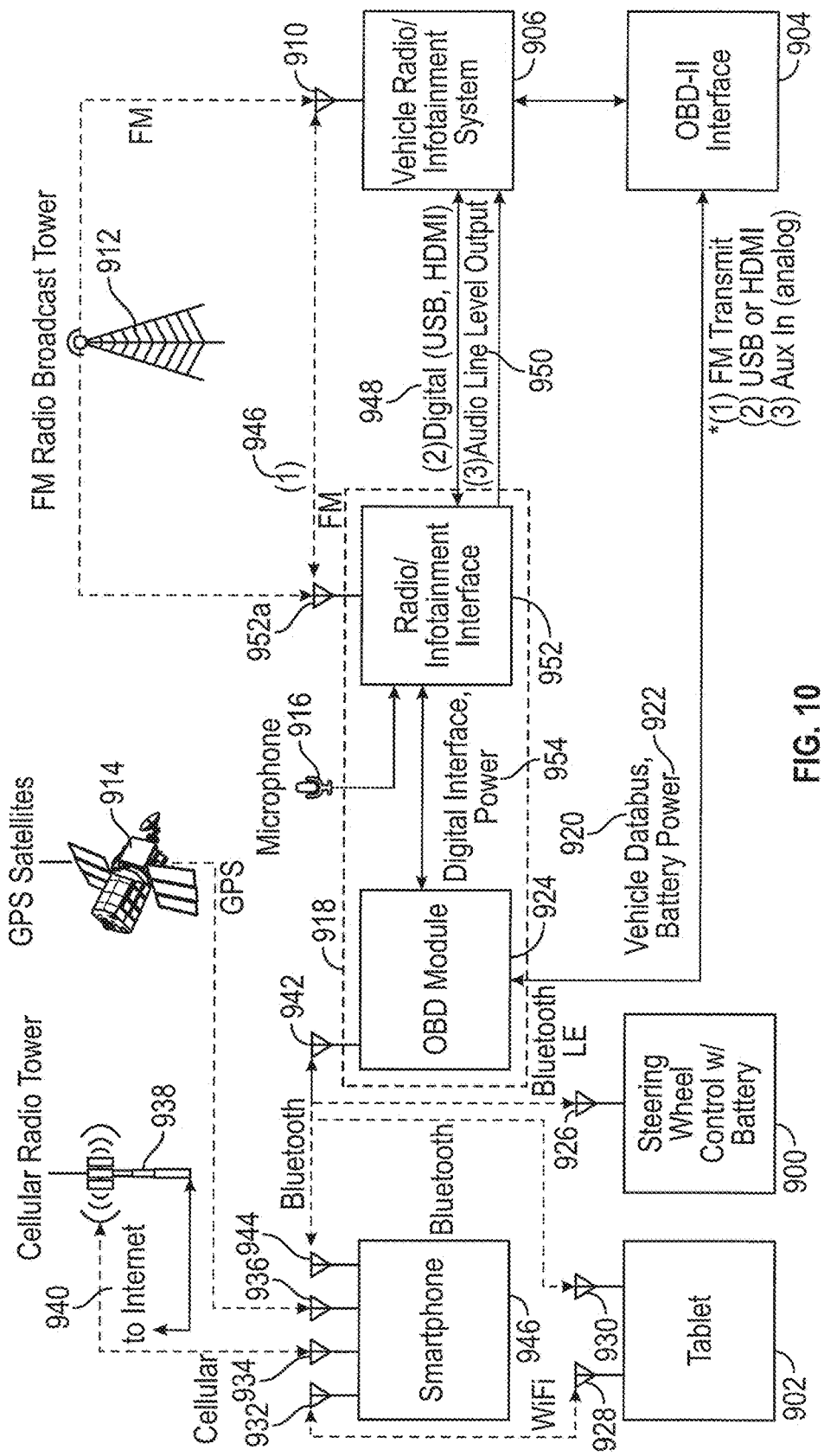
FIG. 10 is a tenth schematic diagram showing the components of the connected vehicle system with infotainment interface.

With reference to FIG. 10, in an exemplary embodiment, interface module 918 includes OBD module 924 that is in electronic communication with vehicle databus 920 and receives battery, or vehicle, power 922 through the OBD-II vehicle interface 904. Interface module 918 also includes radio/infotainment interface 952. Interface 952 and module 924 are in electronic communication via link 954 through which interface 952 is powered and/or exchanges digital information with module 924. OBD module 924 is in radiofrequency communication, e.g., via Bluetooth® or Bluetooth® LE from antenna 942, with tablet 902, smartphone 946, and steering wheel control 900 using antennas 930, 944, 908, and 926, respectively. Radio infotainment interface 952 receives FM broadcasts via antenna 952a; as well, interface 952 is in electronic communication with vehicle radio/infotainment system 906 by one or more modes, e.g., FM signal 946, digital interface 948, and/or audio line 950. Interface 952 may also receive FM broadcasts from FM tower 912. Smartphone 946 is in radiofrequency communication, e.g., via Wi-Fi®, with Tablet 902 using antennas 932 and 928 respectively. Smartphone 946 is electronically linked to the internet 940 through cellular tower, or hub, 938 using antenna 934. Smartphone 946 may also receive GPS signals at antenna 936 from GPS satellites 914. An FM radio broadcast tower 912 transmits a signal to FM antenna 910. OBD-II interface 904 is also in electronic communication with vehicle radio/infotainment system 906.

Figure 11:
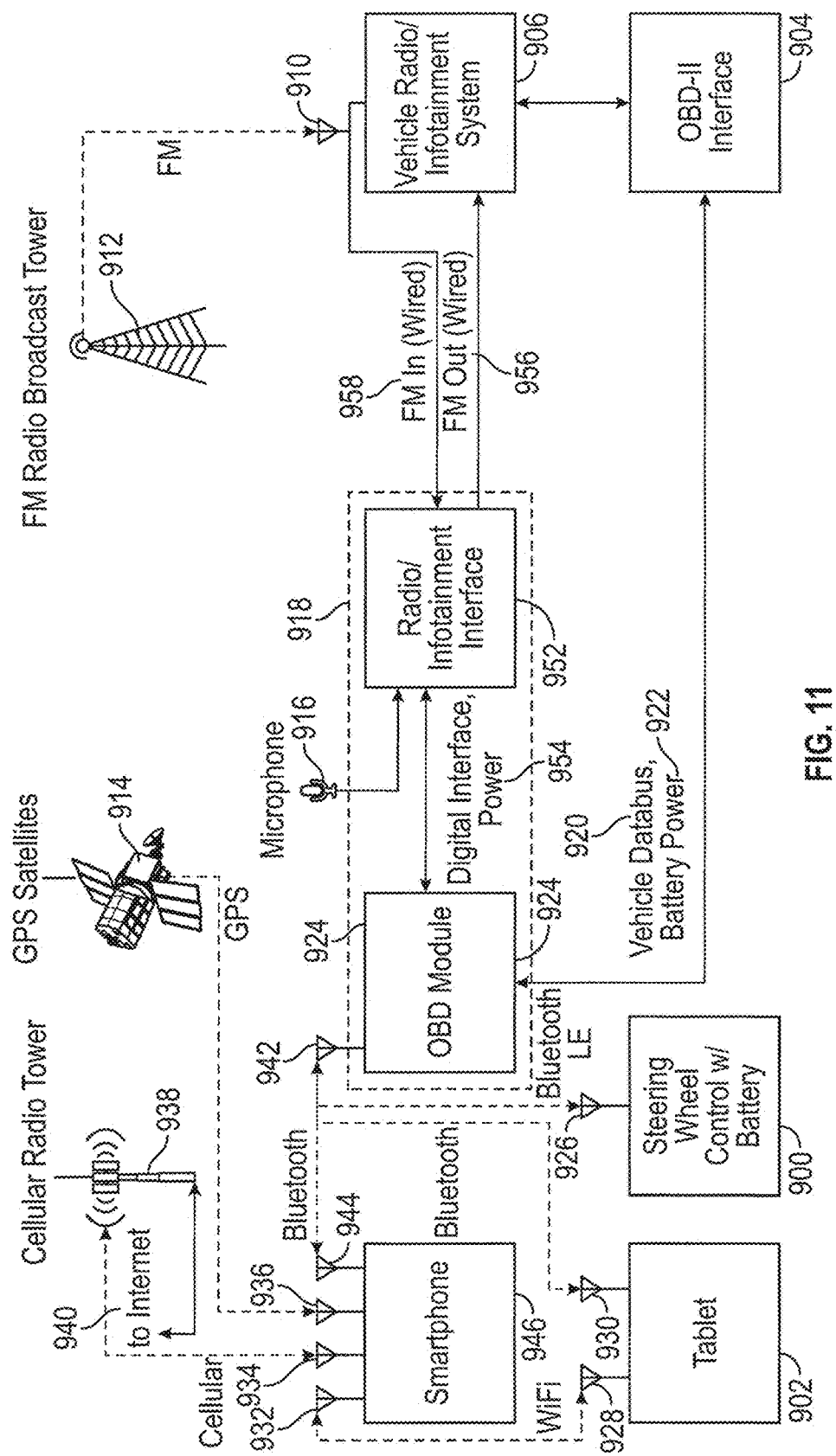
FIG. 11 is a eleventh schematic diagram showing the components of the connected vehicle system with infotainment interface.

With reference to FIG. 11, in an exemplary embodiment, interface module 918 includes OBD module 924 that is in electronic communication with vehicle databus 920 and receives battery, or vehicle, power 922 through the OBD-II vehicle interface 904. Interface module 918 also includes radio/infotainment interface 952. Interface 952 and module 924 are in electronic communication via link 954 through which interface 952 is powered and/or exchanges digital information with module 924. OBD module 924 is in radiofrequency communication, e.g., via Bluetooth® or Bluetooth® LE from antenna 942, with tablet 902, smartphone 946, vehicle radio/infotainment system 906, and steering wheel control 900 using antennas 930, 944, 908, and 926, respectively. An FM radio broadcast tower 912 transmits a signal to FM antenna 910. Radio infotainment interface 952 is in electronic communication with vehicle radio/infotainment system 906 by wired FM-In connection 958 and wired FM-out connection 956. Interface 952 may also receive FM broadcasts from FM tower 912, Smartphone 946 is in radiofrequency communication, e.g., via Wi-Fi®, with Tablet 902 using antennas 932 and 928 respectively. Smartphone 946 is electronically linked to the internet 940 through cellular tower 938 using antenna 934. Smartphone 946 may also receive GPS signals at antenna 936 from GPS satellites 914. OBD-II interface 904 is also in electronic communication with vehicle radio/infotainment system 906.

Figure 12:
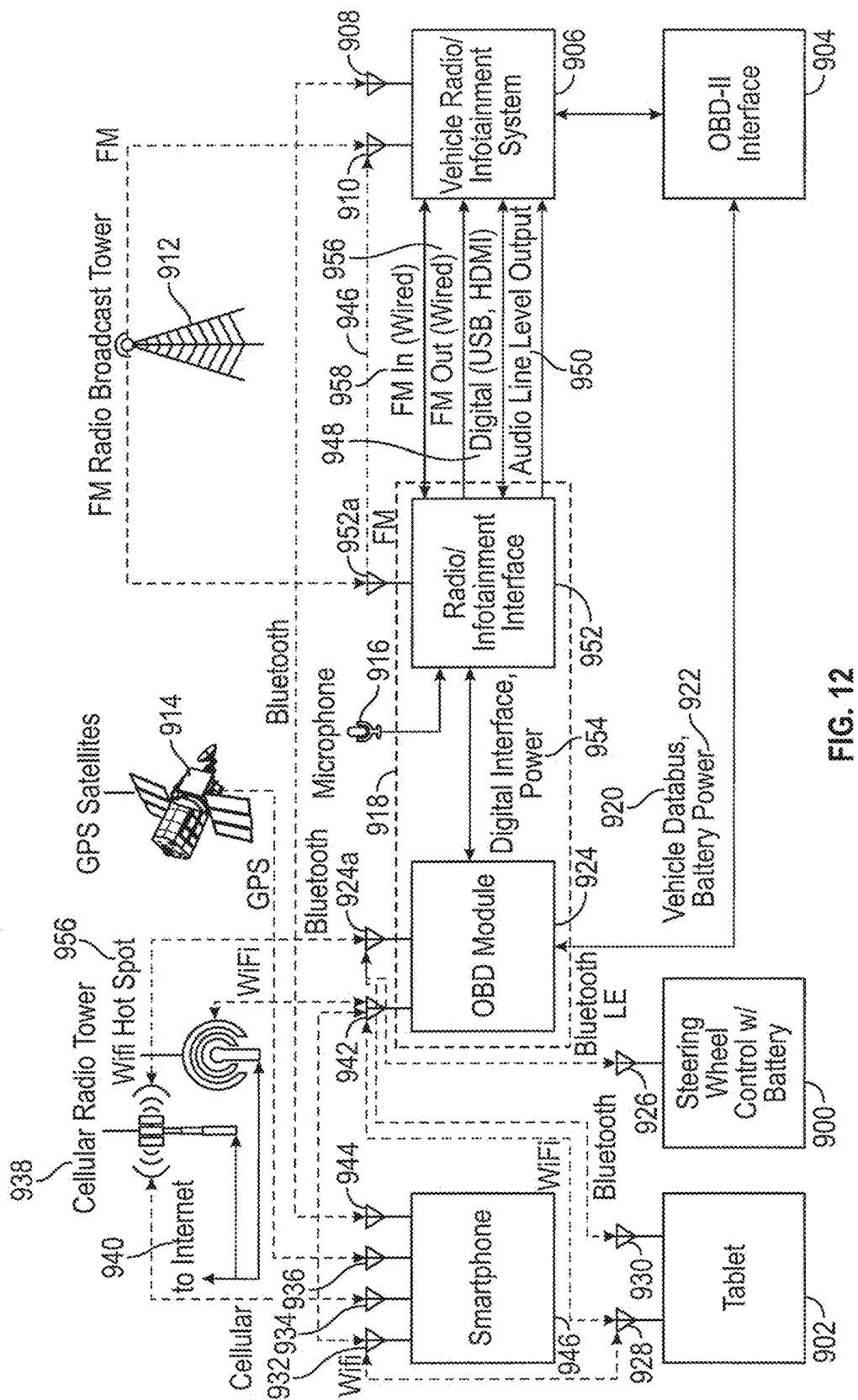
FIG. 12 is a twelfth schematic diagram showing the components of the connected vehicle system with infotainment interface.

With reference to FIG. 12, in an exemplary embodiment, interface module 918 includes OBD module 924 that is in electronic communication with vehicle databus 920 and receives battery, or vehicle, power 922 through the OBD-II vehicle interface 904. Interface module 918 also includes radio/infotainment interface 952. Interface 952 and module 924 are in electronic communication via link 954 through which interface 952 is powered and/or exchanges digital information with module 924. OBD module 924 is in radiofrequency communication, e.g., via Bluetooth® or Bluetooth® LE, or Wi-Fi®, from antennas 942 and 924a, with tablet 902, smartphone 946, vehicle radio/infotainment system 906, and steering wheel control 900 using antennas 928/930, 944/932, 908, and 926, respectively. Module 924 also is in electronic communication with a Wi-Fi® hotspot 956 that transmits digital information to/from the internet 940. An FM radio broadcast tower 912 transmits a signal to FM antenna 910. Radio infotainment interface 952 is in electronic communication with vehicle radio/infotainment system 906 by wired FM-In connection 958 and wired FM-out connection 956. As well, interface 952 is in electronic communication with vehicle radio/infotainment system 906 by one or more modes, e.g., FM signal 946, digital interface 948, and/or audio line level output 950. Interface 952 may also receive FM broadcasts via antenna 952a from FM tower 912. Smartphone 946 is in radiofrequency communication, e.g., via WiFi®, with tablet 902 using antennas 932 and 928 respectively. Smartphone 946 is electronically linked to the internet 940 through cellular tower 938 using antenna 934. Smartphone 946 may also receive GPS signals at antenna 936 from GPS satellites 914. OBD-II interface 904 is also in electronic communication with vehicle radio/infotainment system 906.

Figure 13:
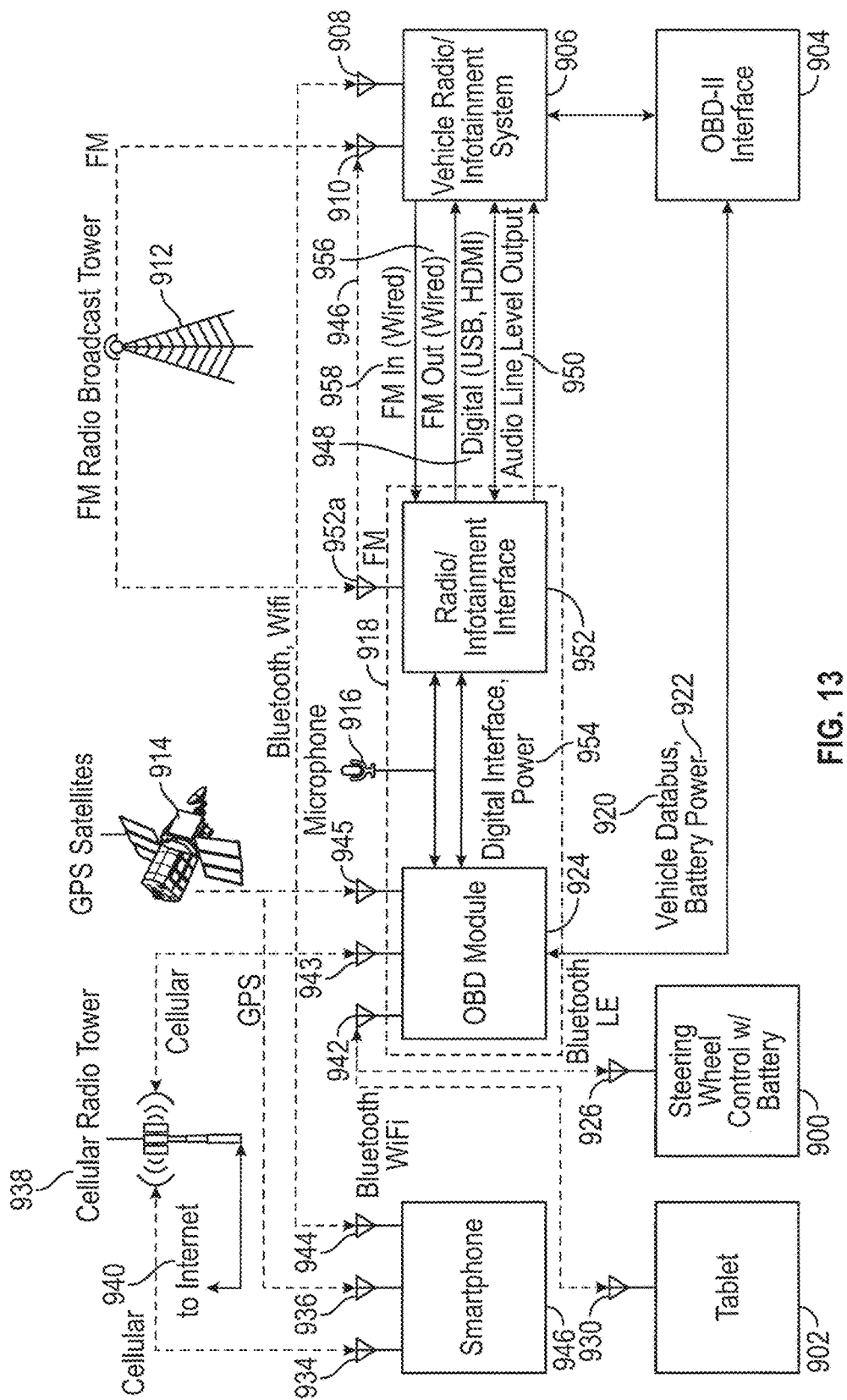
FIG. 13 is a thirteenth schematic diagram showing the components of the connected vehicle system with infotainment interface.

With reference to FIG. 13, in an exemplary embodiment, interface module 918 includes OBD module 924 that is in electronic communication with vehicle databus 920 and receives battery, or vehicle, power 922 through the OBD-II vehicle interface 904. Interface module 918 also includes radio/infotainment interface 952. Interface 952 and module 924 are in electronic communication via link 954 through which interface 952 is powered and exchanges digital information with module 924. Both OBD module 924 and Interface 952 receive input from microphone 916. OBD module 924 is in radiofrequency communication, e.g., via Bluetooth® or Bluetooth® LE, or Wi-Fi®, with tablet 902, and steering wheel control 900 using antennas 942, 930, and 926, respectively. OBD module 924 may also receive GPS information via antenna 945 from GPS satellites 914; OBD module 924 may also connect to the internet through cellular tower 938 and antenna 943. An FM radio broadcast tower 912 transmits a signal to vehicle FM antenna 910. Radio infotainment interface 952 is in electronic communication with vehicle radio/infotainment system 906 by one of the following connections: wired FM-In connection 958 and wired FM-out connection 956. As well, interface 952 is in electronic communication with vehicle radio/infotainment system 906 by one or more modes, e.g., FM signal 946, digital interface 948, and/or audio line 950. Interface 952 may also receive FM broadcasts via antenna 952a from FM tower 912. Smartphone 946 is in radiofrequency communication, e.g., via Wi-Fi®, with Tablet 902 using antennas 932 and 928 respectively. Smartphone 946 is electronically linked to the internet 940 through cellular tower, or hub, 938 using antenna 934. Smartphone 946 may also receive GPS signals at antenna 936 from GPS satellites 914. OBD-II interface 904 is also in electronic communication with vehicle radio/infotainment system 906.

Figure 14:
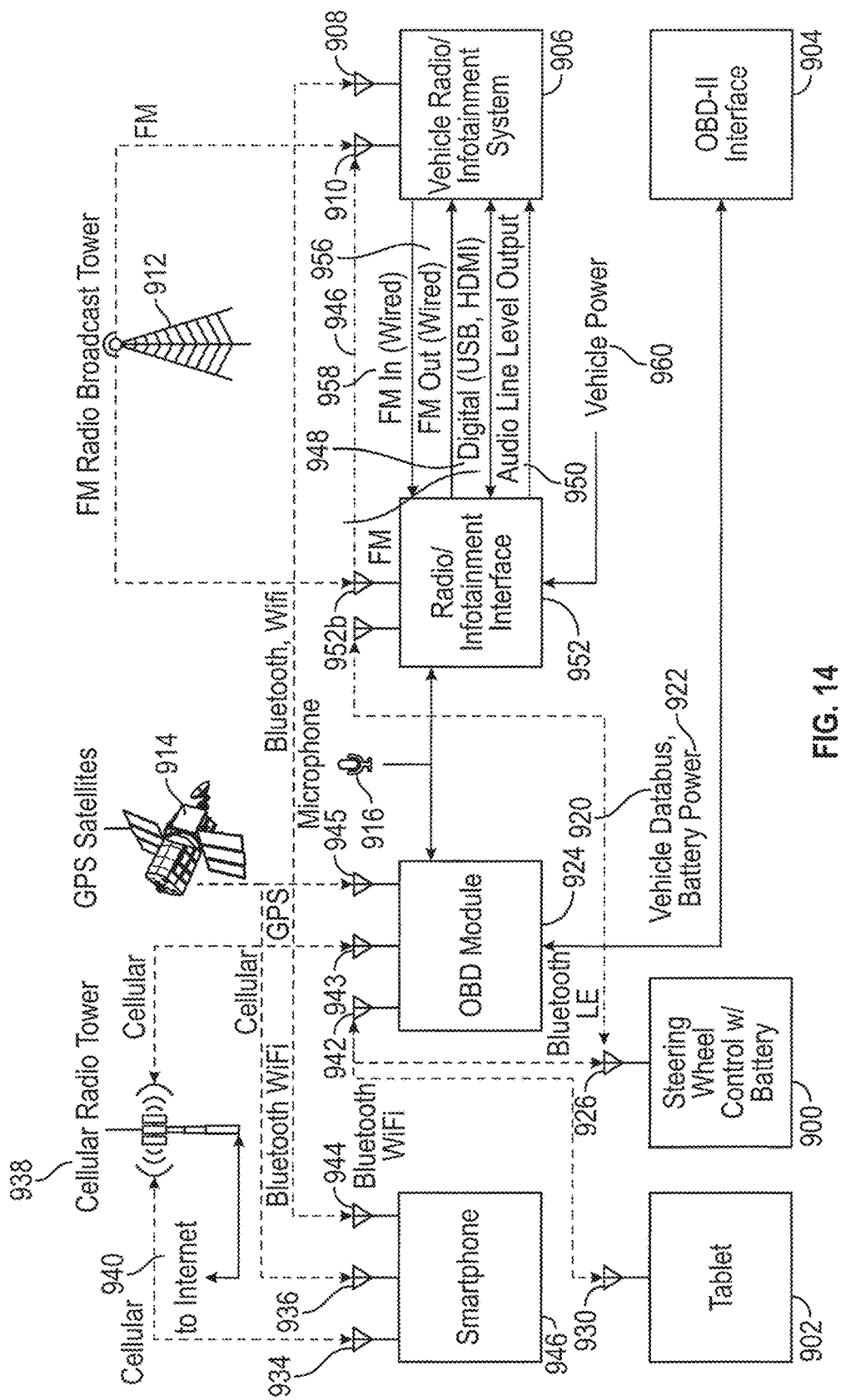
FIG. 14 is a fourteenth schematic diagram showing the components of the connected vehicle system with infotainment interface.

With reference to FIG. 14, in an exemplary embodiment, OBD module 924 is in electronic communication with vehicle databus 920 and receives battery, or vehicle, power 922 through the OBD-II vehicle interface 904. OBD module 924 is in radiofrequency communication, e.g., via Bluetooth® or Bluetooth® LE, or Wi-Fi®, from antenna 942, with tablet 902 and steering wheel control 900 using antennas 930, and 926 respectively. OBD module 924 may also receive GPS information via antenna 945 from GPS satellites 914; OBD module 924 may also connect to the internet through cellular tower 938 and antenna 943.

Radio/Infotainment Interface 952 receives input from microphone 916. Microphone 916 may provide input to OBD module 924. Interface 952 is in electronic communication with vehicle radio/infotainment system 906 by one of the following connections: wired FM-In connection 958 and wired FM-out connection 956. As well, interface 952 is in electronic communication with vehicle radio/infotainment system 906 by one or more modes, e.g., FM signal 946 between antennas 952a and 910, digital interface 948, and/or audio line output level 950. Interface 952 may also receive FM broadcasts via antenna 952a from FM tower 912 and be powered by vehicle power 960 that is separate from the power connection to module 924. Smartphone 946 is electronically linked to the internet 940 through cellular tower, or hub, 938 using antenna 934. Smartphone 946 may also receive GPS signals at antenna 936 from GPS satellites 914. OBD-II interface 904 is also in electronic communication with vehicle radio/infotainment system 906.

FIG. 17 shows a radio/infotainment interface module 13 with an OBD digital interface connector 2101, an audio line output connector 2102, a vehicle radio digital interface connector 2103, an FM output connector 2104 and an FM input connector 2105.

Figure 17A:
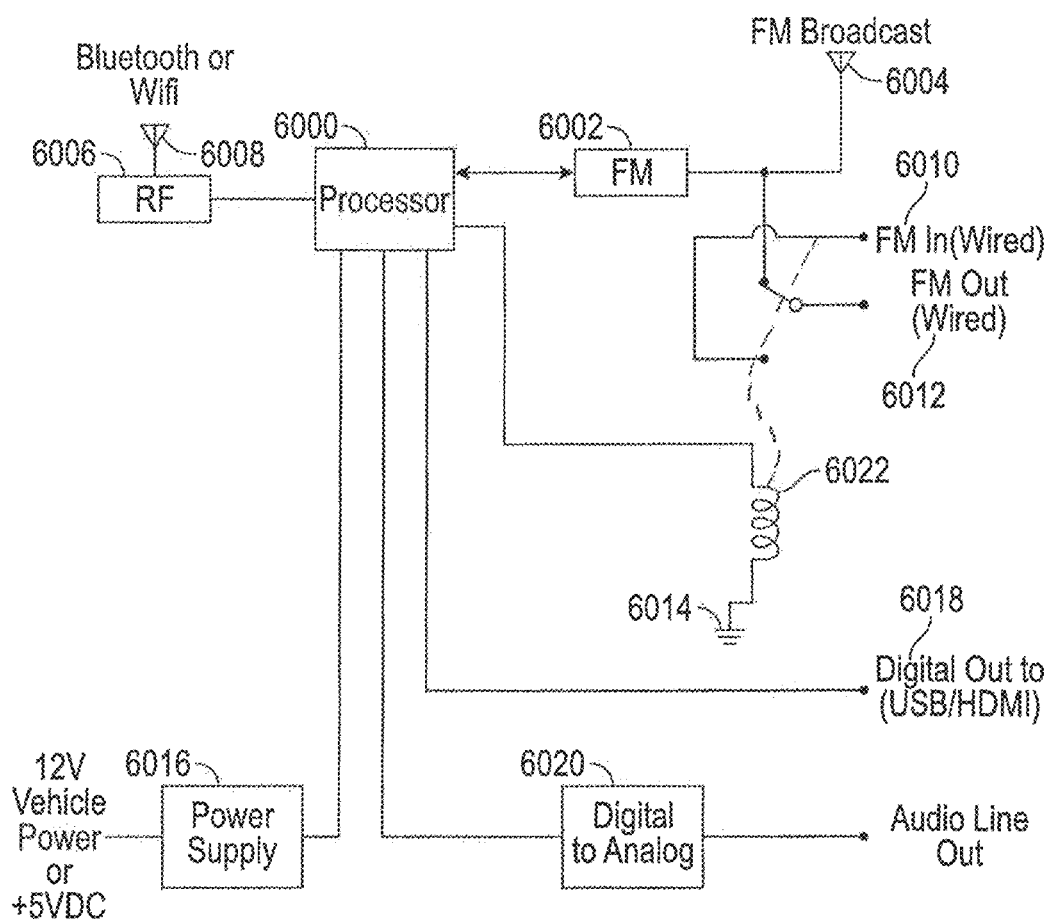
FIG. 17A is a schematic diagram of the radio/infotainment interface of FIGS. 1-14.

FIG. 17A is a functional block diagram illustrating an exemplary, non-limiting aspect of a radio/infotainment interface module ("RIIM") 13/93/952 for implementing the described systems and methods. Processor 6000 may embody one or more CPU modules 5102 as described in FIG. 15C. Processor 6000 is connected to FM modulator module 6002. Module 6002 may include an FM transceiver antenna 6004. Processor 6000 is also connected to RF module 6006 that is in RF (e.g., Wi-Fi, or Bluetooth) communication with other system components through RF antenna 6008. FM modulator module 6002 output is also connected to relay 6022 contacts. Relay 6022 is controlled by processor 6000 to move relay contacts which direct either FM modulator 6002 output or FM In (Wired) 6010 onto FM Out (Wired) 6012 Processor 6002 is connected to coil 6022 and which is in turn connected to ground 6014, and receives power from OBD module 10/100/924 or from an independent power source 6016. Processor 6002 transmits digital output to USB/Digital interface 6018. Analog output is routed through digital/analog converter 6020.

With respect to FIGS. 1-6, for example, in an exemplary embodiment, in operation the user would install the OBD module 10 on the vehicle OBD-II interface 64 connector and perform setup procedures to identify the correct vehicle data bus pins to utilize for all data transfer. The user would download a specified software application (app) to the mobile device 30 and connect (or alternatively pair) the mobile device's short-range antenna 38 to the module's short-range antenna 20 using software procedures of the mobile device 30. The OBD module 10 would request information from the vehicle data bus using the vehicle interface 15 and the information would be transferred to a mobile device app or to one or servers on the internet for further processing and display. Typical data being read would include: vehicle identification number (VIN), engine RPM, vehicle speed, fuel level, malfunction indication light, diagnostic trouble codes, odometer and other useful data.

In addition to data bus information, the OBD module 10 may monitor and/or measure battery voltage and GPS data (i.e. latitude, longitude, altitude, speed and heading). The system may utilize an Internet data connection to enhance available features and also a GPS receiver to facilitate location-based services.

The systems of FIGS. 1, 2 and 3 would utilize the mobile device 30 to establish an Internet data connection via its long-range antenna 32. The systems may utilize a GPS antenna 34 for location-based services. The systems of FIG. 4 and FIG. 12 may utilize either a WiFi access point 71 or the mobile device 30 for Internet data connection and the mobile device 30 GPS antenna 34 for location-based services. The systems of FIGS. 5-8 and 12-14 may utilize the OBD module 10 long-range antenna 21 for internet data connection and GPS antenna 23 for location-based services.

In an embodiment, the user may determine the appropriate method for connecting to his/her vehicle radio/infotainment system 63 for audio and, optionally, video inputs. The methods available are: Bluetooth (FIG. 1, 4, 5, or 6), FM broadcast (FIG. 2, 4, 5, or 6), FM wired inline (FIG. 3, 4, 5, or 6), audio line level input (FIG. 2, 4, 5, or 6) or digital interface (FIG. 2, 4, 5, or 6). The vehicle radio/infotainment system 63 would be set to accept the transmitted information by selecting the appropriate input: Bluetooth, FM, Aux or USB/HDMI.

With reference to FIGS. 1-6, in an embodiment, if Bluetooth is chosen as the connection method, controller 14 may send audio/video information to RF transceiver 11 and the information be broadcast from short range antenna 20 to short range antenna 61. For all other methods, controller 14 may send audio/video information to radio/infotainment interface 13. Interface 13 may then rebroadcast the information on one or more of its outputs according to the user's chosen connection method.

With reference to FIGS. 3-6, in another embodiment, if an FM-In wired connection is used, the user disconnects the vehicle radio antenna 62 from the vehicle radio/infotainment system 63 and connects antenna 62 through FM-in connector 104 and connects FM-out connector 105 to an antenna input connector on the vehicle radio/infotainment system 63.

With reference to FIGS. 2, 4, 5, 6, and 17, if an audio line level input 500 connection is used, the user connects a cable from audio line out connector 2102 to an Aux In connector 3502 of the vehicle radio/infotainment system 63. If digital interface is used, the user would connect a cable from vehicle radio digital interface connector 2103 to the USB or HDMI connector 501 of the vehicle radio/infotainment system 63.

If FM broadcast is the connection method used, one of two means would be utilized to determine the appropriate broadcast frequency. The first means comprises the OBD module 10 obtaining a GPS location and utilizing either a locally-stored table or a remotely-stored table of radio transmitter locations and transmit power levels to determine the quietest frequencies for the current location.

Figure 18:
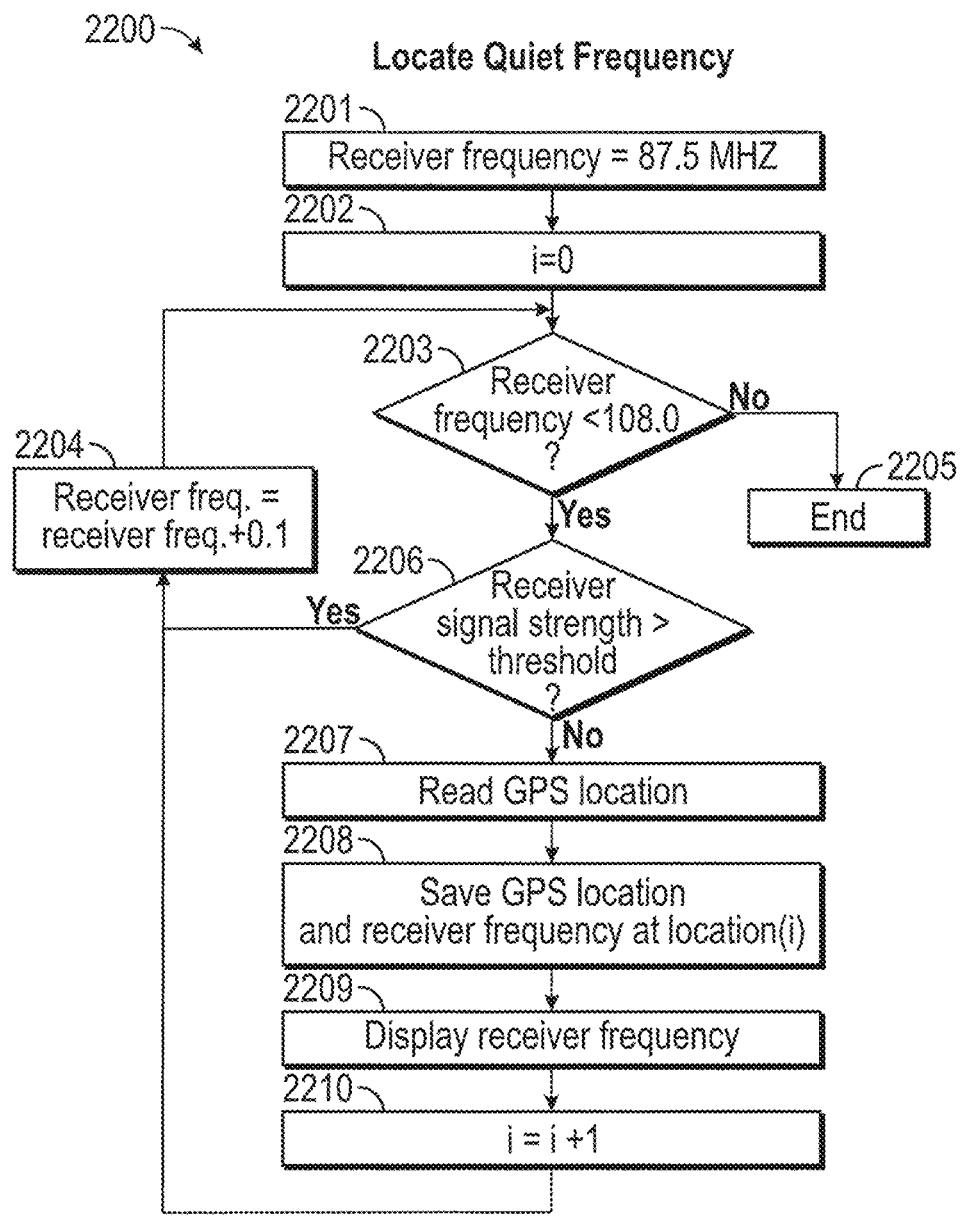
FIG. 18 is a flowchart of a process to locate a quiet FM frequency for FM radio frequency broadcast and reception of components of the systems of FIGS. 1, 2, 3, 4, 5 and 6.

The second means of connecting by FM broadcast comprises determining all available quiet frequencies by scanning the broadcast spectrum for all frequencies with signal strengths below a preset threshold, using e.g., long-range antenna 25 and an FM receiver within radio/infotainment interface 13. FIG. 18 shows the steps involved in determining quiet frequencies. Step 2201 sets the FM receiver frequency to 87.5 MHz. Step 2202 sets a memory array index to 0. Step 2203 tests whether the receiver frequency is less than 108.0 MHz. If no, the last frequency has been scanned and step 2205 ends the process. If yes, step 2206 tests whether a received signal strength of an FM signal received by the receiver is greater than a preset quiet threshold for the interface. If the received signal strength is yes, step 2204 increases the receiver frequency by 0.1 MHz and the method returns to step 2203. If the signal strength does not exceed the preset quiet threshold, step 2207 reads the current GPS location from a GPS receiver or e.g., mobile device 30. Step 2208 saves the current GPS location and receiver frequency in a memory array location "i" either in a controller or to a mobile device 30 app or an internet server using an internet connection. Step 2209 displays the transmitter frequency, e.g., on the mobile device 30. Step 2210 increments the memory array index i and returns to step 2204. The software application on e.g., mobile device 30 then displays to the user all available quiet frequencies detected and the current transmitter frequency, giving the user the option to select a different transmitter frequency, and the user tunes the vehicle radio/infotainment system 63 to that frequency.

With reference to FIGS. 1-6, the user then initiates audio or, optionally, video content playback from the mobile device 30 which is transmitted wirelessly with Bluetooth® or Wi-Fi® to the OBD module short-range antenna 20, through RF transceiver 11 and to controller 14. Controller 14 determines the appropriate connection method and playback is then broadcast to the vehicle radio/infotainment system 63 according to the chosen method.

In an embodiment, control of audio/video playback is executed using switch module 40 (e.g., module 1040 in FIG. 16A, or module 2000 in FIG. 16B). A user may utilize volume up and down buttons 1092, seek back button 1094, seek forward button 1096 and pause/play button 1095. The menu button 1091 and up/down/left/right/OK buttons 1092 may be used to control functions built into a mobile device software application as an alternative to touchscreen display 37 buttons on the mobile device 30.

In an alternative embodiment, mobile device 30 may wirelessly transmit audio/video information to tablet display 45 using medium range antenna 31 and medium range antenna 46 to RF transceiver 49 and controller 48. The audio/video information then is displayed on the touchscreen display 50 using the tablet 45's hardware/software. The audio information from tablet display 45 could be sent via short range antenna 47 to short range antenna 20 for rebroadcast to the vehicle radio/infotainment system 63 using previously-described processes. Touchscreen display 50 could be used in this configuration for control of audio/video playback and app selection.

Hands-free phone calling may also be supported such that incoming calls to the mobile device 30 may be answered by pressing call button 1097 and ended by pressing hang-up button 1098. Outgoing calls may be initiated and ended with the same button. The mobile device 30 may interface with the control switch module such that voice-recognition features of the mobile device 30 may be used to specify numbers to call. A mobile device application may be used to switch between microphone 38 or microphone 24 for phone calling or voice commands. A mobile device 30 application could also permit switching the output of the OBD module 10 to be sent to the vehicle radio/infotainment system 63 or a user's personal headset or wireless headset.

The systems depicted in any of the configurations, e.g., FIGS. 1-6, utilizes a method where the system determines the "quiet" spaces within the FM radio spectrum at the current location using either a lookup within a radio locator table using current GPS position or by scanning the FM spectrum with a receiver and presenting the user via display or smartphone application with choices of available frequencies to select for setting the transmitter frequency. The vehicle radio is tuned to that same frequency and receives the transmitted information via its' antenna.

With reference to FIG. 7 and FIG. 8, in operation the user would install the connected vehicle device 100 on the vehicle OBD-II interface 111 connector and perform setup procedures to identify the correct vehicle databus pins to utilize for all data transfer. The user would download a specified software application (app) to the mobile device 80 and connect (alternatively: pair) the mobile device's short-range antenna 78 to the connected vehicle device's short-range antenna 120 using software procedures of the mobile device 80. The OBD module 100 would request information from the vehicle databus 127 using the vehicle interface 95 and the information would be transferred to the mobile device app or to servers on the internet for further processing and display. Typical data being read would include: vehicle identification number (VIN), engine RPM, vehicle speed, fuel level, malfunction indication light, diagnostic trouble codes, odometer and other useful data. In addition to databus information, the OBD module 100 will also measure battery voltage and GPS data (i.e. latitude, longitude, altitude, speed and heading).

Figure 19:
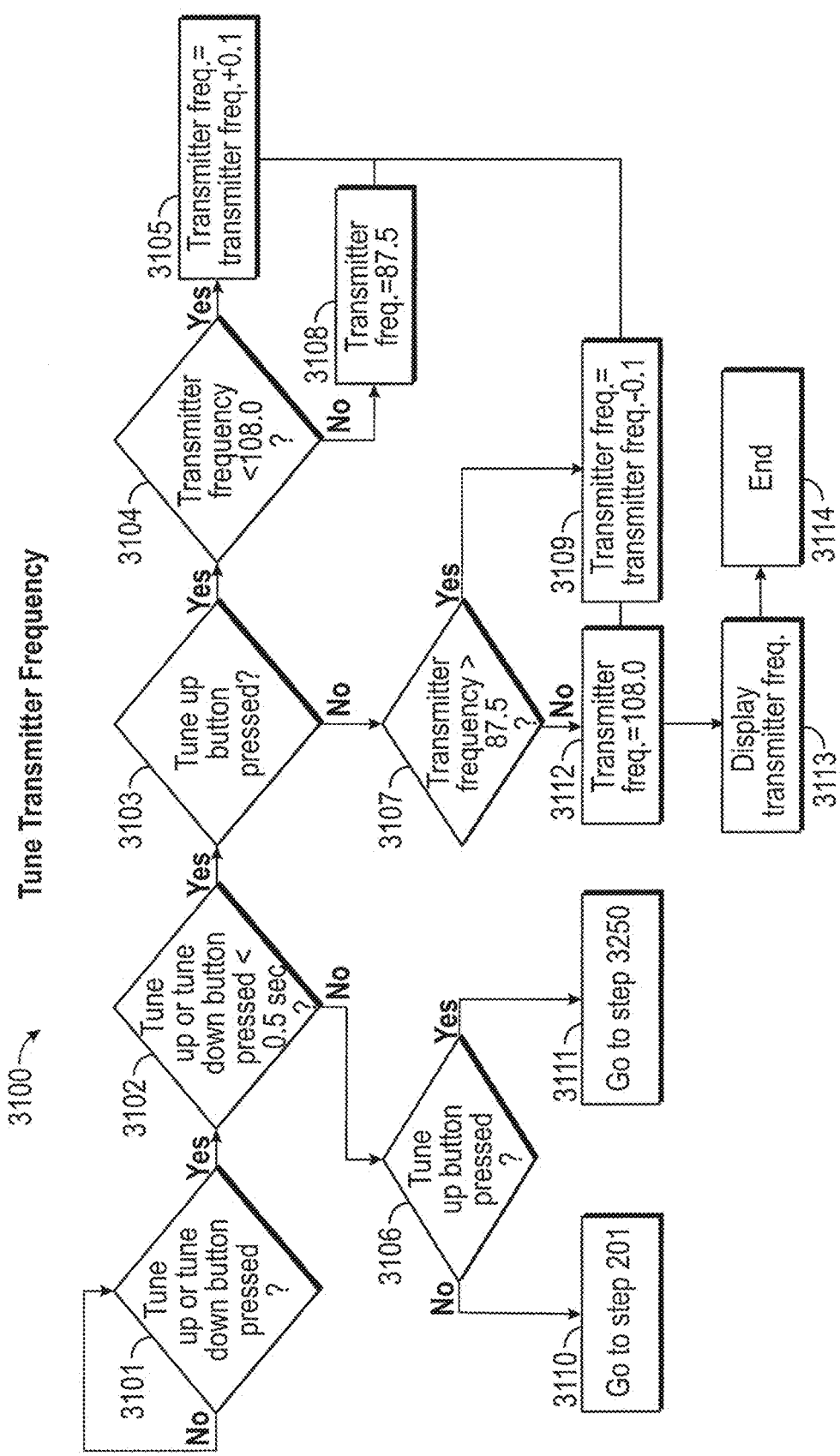
FIG. 19 is a flowchart of the tune transmitter frequency process for the described system of FIG. 7.
Figure 20:
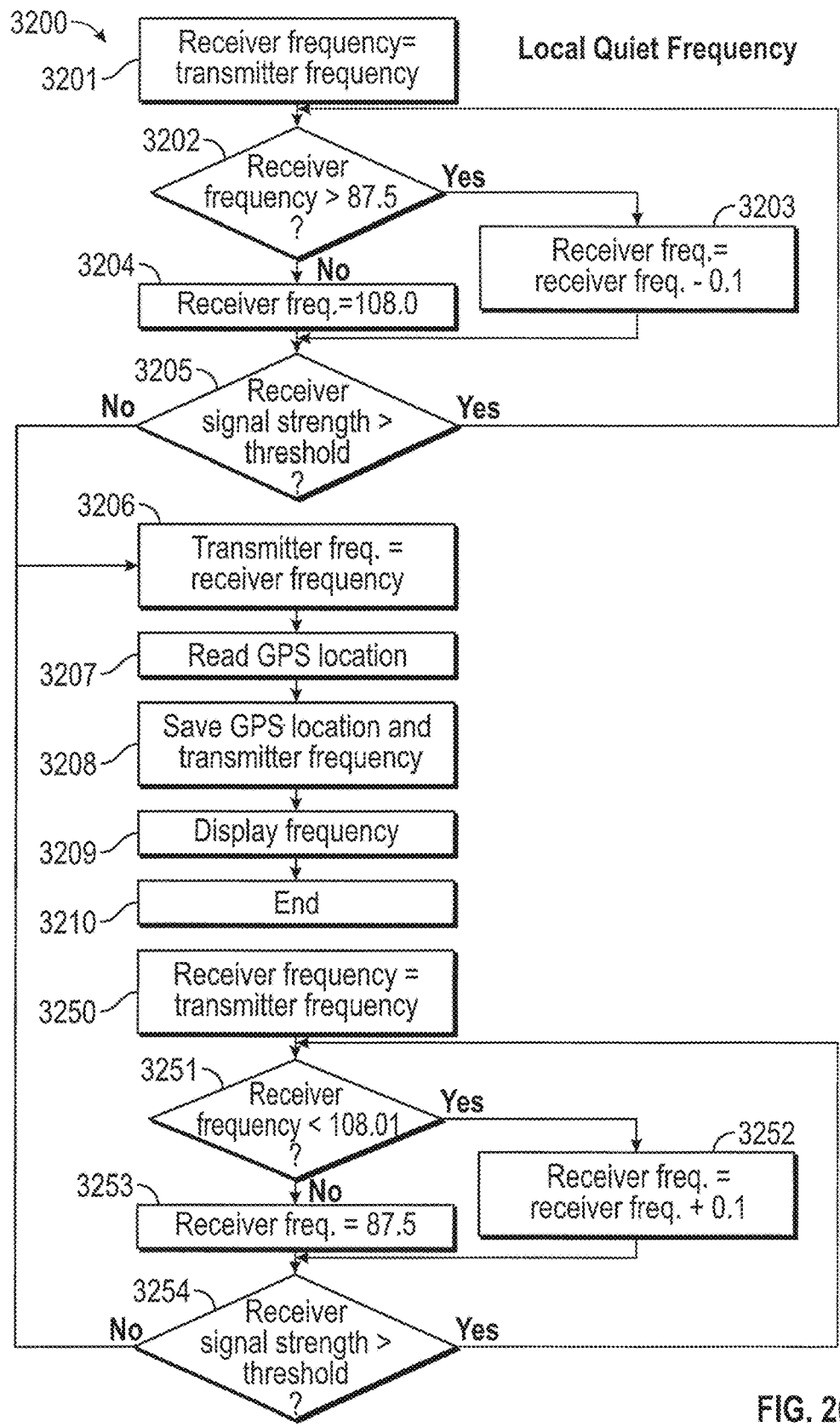
FIG. 20 is a flowchart of a process to locate a quiet FM frequency for FM radio frequency broadcast and reception of components of the systems of FIG. 7.

With reference to FIG. 7, FIG. 8, FIG. 18, FIG. 19, FIG. 20, and FIG. 16A, the user selects the appropriate method for connecting to their vehicle radio/infotainment system 112. The methods available are: FM broadcast, audio line level input (Aux) or digital interface (e.g. USB or HDMI). The vehicle radio/infotainment system 112 would be set to accept the transmitted information by selecting the appropriate input: FM, Aux or USB/HDMI. If the system of FIG. 7 is being used and FM broadcast is the connection method, manually tuning up or tuning down in FM frequency would start the process. In an exemplary embodiment, FIGS. 19 and 20 show the steps involved in tuning the transmitter frequency. Tune transmitter frequency flowchart 3100 begins at step 3101 which continually tests for the user tuning up or tuning down (e.g., by pressing buttons 1099 and 1100) the FM frequency range. If yes, step 3102 tests whether the button has been pressed less than 0.5 seconds. If yes, step 3103 tests whether the tune up button 1100 is pressed. If yes, step 3104 tests whether the transmitter frequency is less than 108.0 MHz. If yes, step 3105 increments the transmitter frequency by 0.1 MHz. If no, step 3108 sets the transmitter frequency to 87.5 MHz. If step 3103 tests no, the tune down button 1099 must be pressed and step 3107 tests whether the transmitter frequency is greater than 87.5 MHz. If yes, step 3109 decrements the transmitter frequency by 0.1 MHz. If no, step 3112 sets the transmitter frequency to 108.0 MHz. Step 3113 displays the transmitter frequency on display 1101. Step 3114 ends the tune process. If step 3102 tests no, step 3106 tests whether the tune up button 1100 is pressed. If yes, step 3111 jumps to locate quiet frequency flowchart 3200, step 3250.

With respect to FIG. 20, if step 3106 tests no, step 3110 jumps to locate quiet frequency flowchart 3200, step 3201. Step 3201 sets the receiver frequency to the transmitter frequency. Step 3202 tests if the receiver frequency is greater than 87.5 MHz. If yes, step 3203 decrements the receiver frequency by 0.1 MHz. If no, step 3204 sets the receiver frequency to 108.0 MHz. Step 3205 tests whether the received signal strength of the receiver is greater than the quiet threshold established for the system. If yes, processing returns to step 3202. If no, step 3206 sets the transmitter frequency to the receiver frequency. Then step 3207 reads the current GPS location, e.g., from the GPS receiver 12. Step 3208 saves the current GPS location and transmitter frequency in memory either in the controller 14 or to the mobile device 30 app or an internet server using RF transceiver 11. Step 3209 displays the transmitter frequency on display 1101. Step 3210 ends the locate quiet frequency process. Step 3250 sets the receiver frequency to the transmitter frequency. Step 3251 tests whether the receiver frequency is less than 108.0 MHz. If yes, step 3252 increments the receiver frequency by 0.1 MHz. If no, step 3253 sets the receiver frequency to 87.5 MHz. Step 3254 tests whether the received signal strength of the receiver is greater than the quiet threshold established for the system. If yes, processing returns to step 3251. If no, step 3206 sets the transmitter frequency to the receiver frequency. Step 3207 reads the current GPS location, e.g., from the GPS receiver 12. Step 3208 saves the current GPS location and transmitter frequency in memory either in the controller 14 or to the mobile device 30 app or an internet server using RF transceiver 11. Step 3209 displays the transmitter frequency on display 1101. Step 3210 ends the locate quiet frequency process.

Figure 21:
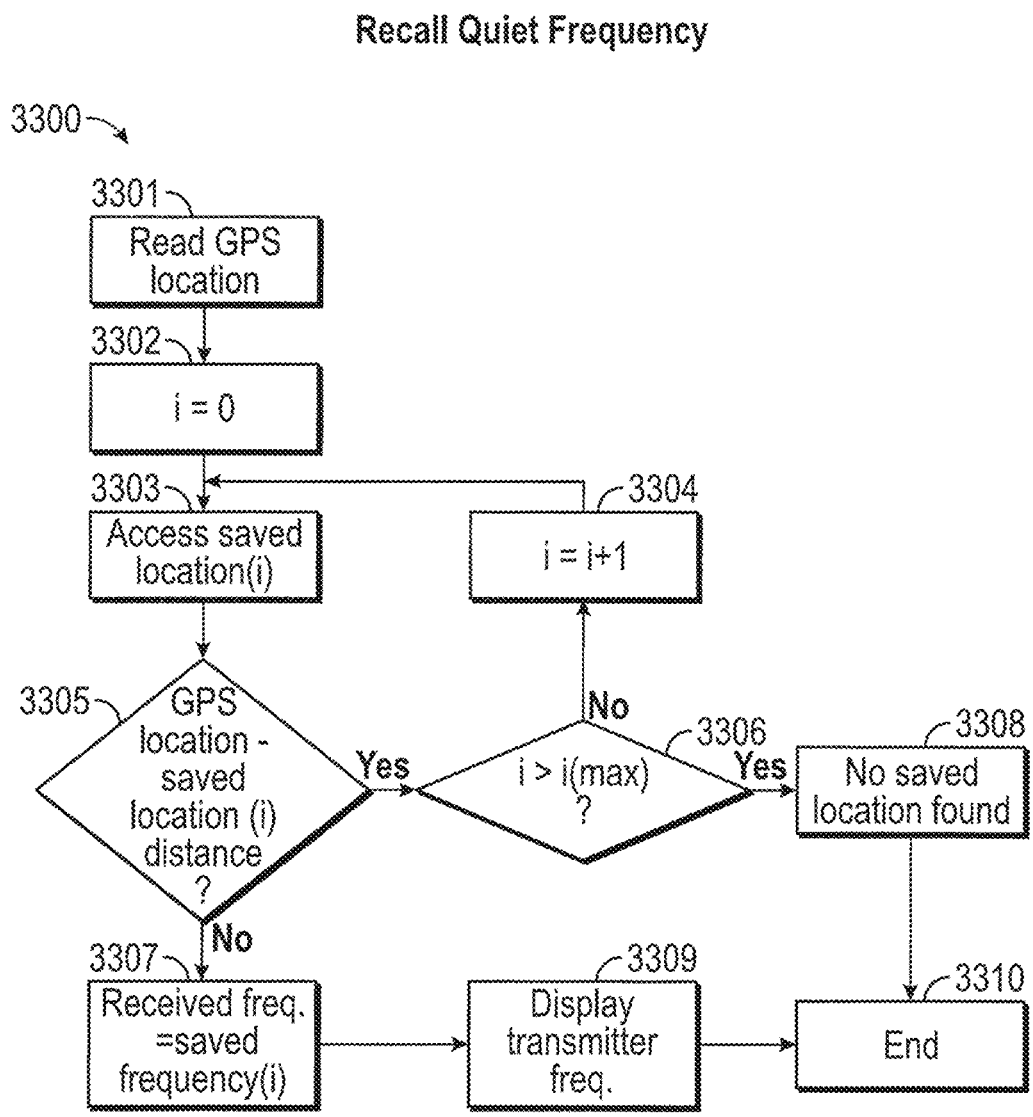
FIG. 21 is a flowchart of the recall quiet frequency process for the systems of FIGS. 2, 4-7, 10, and 12-14.

In an embodiment, FIG. 21 shows the recall quiet frequency process 3300. This process is initiated using menu button 1091 and up/down/left/right/OK buttons 1092 to select this process. Step 3301 reads the current GPS location, e.g., from GPS receiver 92. Step 3302 initiates an array index to 0. Step 3303 accesses the saved GPS location from memory at index 0. Step 3305 tests whether the difference between the current GPS location and the saved location at the current index is greater than a distance threshold established for the system. If yes, step 3306 tests whether the current index value is the last value in memory. If no, step 3304 increments the index by 1 and returns to step 3303. If step 3306 tests yes, step 3308 returns no saved location found in memory for this location. If step 3305 tests no, step 3307 sets the receiver frequency to the saved frequency from the current memory index. Step 3309 displays the transmitter frequency in display 1101. Step 3310 ends the recall quiet frequency process.

In an alternative embodiment, the user utilizes a software application to command the OBD module 100 to scan the available FM broadcast spectrum for "quiet" frequencies which are not occupied by strong radio broadcasts. These frequencies may be saved along with the current GPS location to memory in the controller 94, the mobile device 80 app or an internet server via RF transceiver 71. The software application would show the user all available quiet frequencies detected and the recommended frequency it will use and the user would tune the vehicle radio/infotainment system 112 to that frequency. The systems in FIGS. 2, 4, 5, 6, 7, 10, 12, 13, 14 may use this method. The user would initiate audio or, optionally, video content playback from the mobile device 80 which would be sent wirelessly with Bluetooth® or WiFi® via short-range antenna 90 or via audio line level output via audio line input socket 1073 and such content would then be broadcast on the quiet FM frequency by the radio/infotainment interface 13 to the vehicle radio/infotainment system 112. Control of audio/video playback would be possible using the volume up and down buttons 1092, seek back button 1094, seek forward button 1096 and pause/play button 1095. The menu button 1091 and up/down/left/right/OK buttons 1092 could also be used to control functions built into the mobile device app as an alternative to touchscreen display 73 buttons on the mobile device 80.

Hands-free phone calling would also be supported such that the receipt of incoming calls to the mobile device 80 could be answered by pressing call button 1097 and ended by pressing hang-up button 1098. Outgoing calls could also be initiated and ended with the same buttons and utilize voice-recognition features of the mobile device app to specify numbers to call. The mobile device app could be used to switch between microphone 74 or microphone 75 for phone calling or voice commands. The mobile device app could also permit switching the output of the OBD module 100 to be sent to the vehicle radio/infotainment system 112 or a user's personal wireless headset.

Accordingly, this system could be used by any user with simple instructions to create a vehicle-to-internet connectivity system which will also provide upgraded mobile device-to-infotainment system wireless connectivity options only found in new vehicles and upgraded aftermarket infotainment systems.

Figure 23:
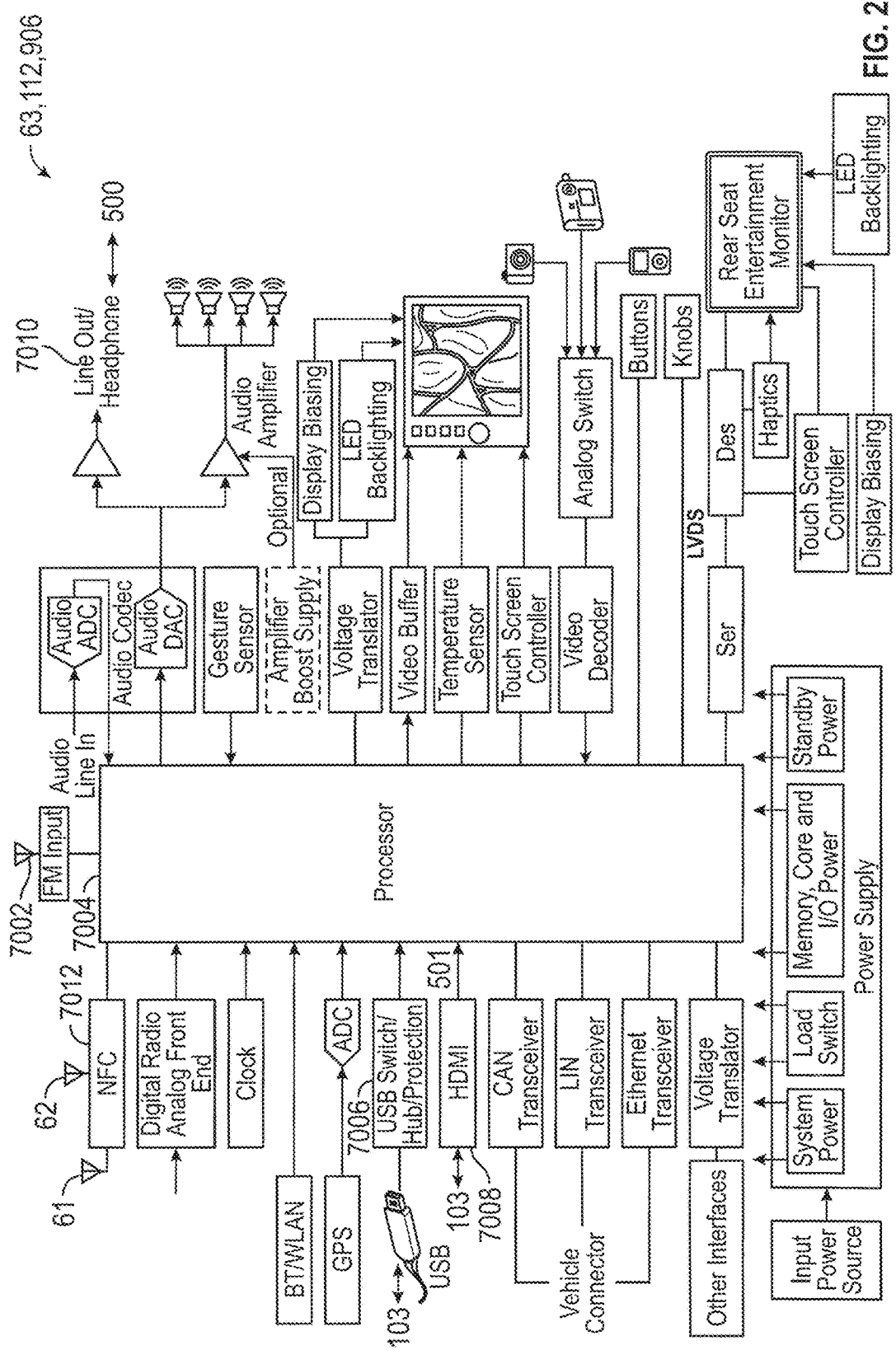
FIG. 23 is a schematic of a radio/infotainment system for a vehicle.

FIG. 23 is a functional block diagram illustrating an exemplary, non-limiting aspect of a radio/infotainment system (RIS) 63/112/906. For example, the RIS system shown in FIG. 23 is described and enabled at http://www.ti.com/solution/automotive_infotainment, which description and hyperlinks are incorporated herein by reference and relied upon. In some exemplary embodiments of the present description, antenna 7002 is connected to processor 7004. Antennas 61 and 62 are connected to NFC/Radiofrequency writer/reader module 7012. USB connection 103 is connected to USB and/or HDMI inputs 7006 and 7008, respectively. Line out 7010 may also be connected to input 500.

Figure 24:
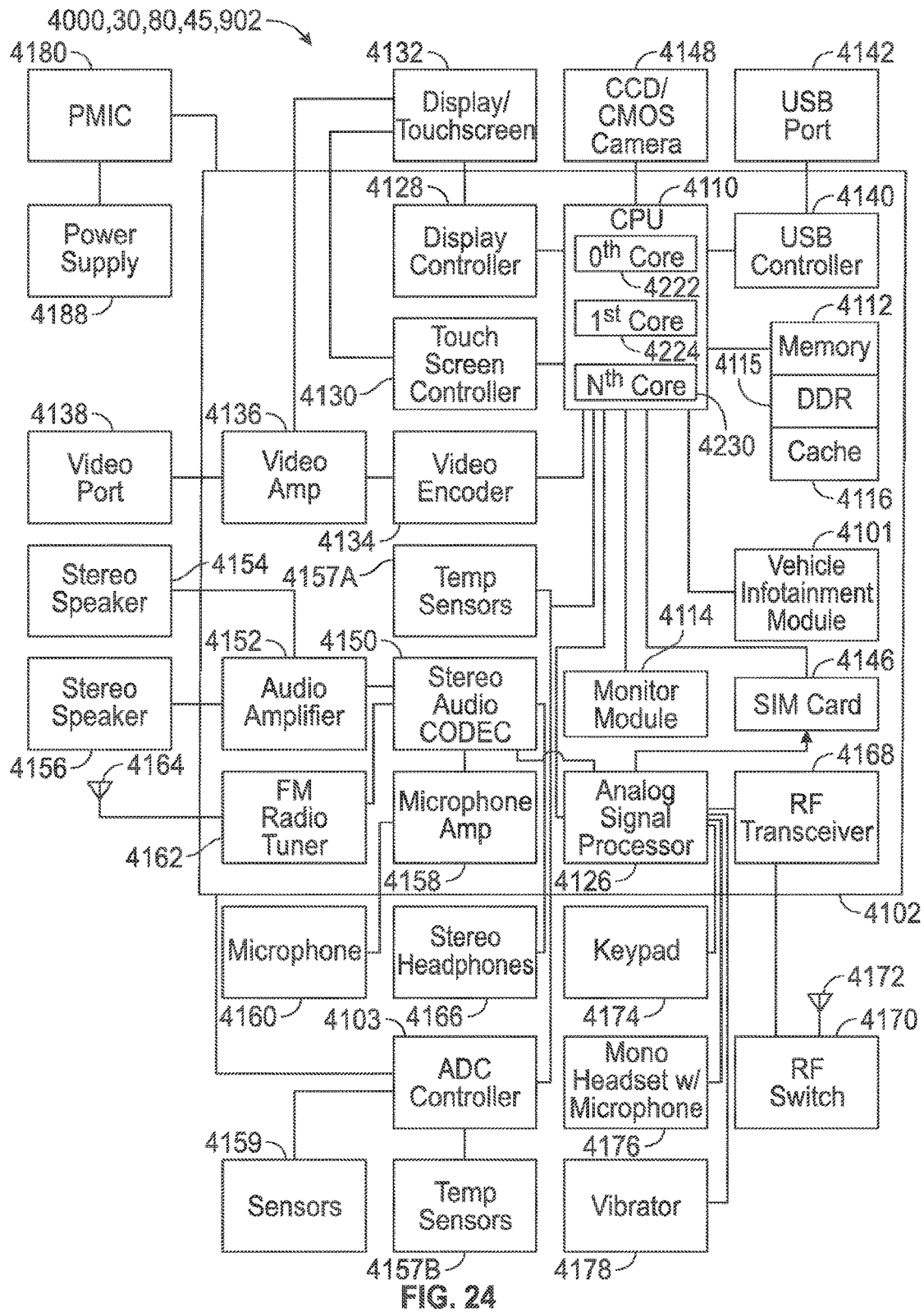
FIG. 24 is a schematic of a smartphone/mobile device/tablet.

FIG. 24 is a functional block diagram illustrating an exemplary, non-limiting aspect of a portable computing device 4000 ("PCD"), such as a mobile device 30, mobile device 80, tablet 45, tablet 902 and the like, for implementing the foregoing systems and methods. The PCD may be in the form of a wireless telephone in some CTM embodiments. As shown, the PCD 4000 includes an on-chip system 4102 that includes a multi-core central processing unit ("CPU") 4110 and an analog signal processor 4126 that are coupled together. The CPU 4110 may comprise a zeroth core 4222, a first core 4224, and an Nth core 4230 as understood by one of ordinary skill in the art. Further, instead of a CPU 4110, a digital signal processor ("DSP") may also be employed as understood by one of ordinary skill in the art.

As illustrated in FIG. 24, a display controller 4128 and a touch screen controller 4130 are coupled to the digital signal processor 4110. A touch screen display 4132 external to the on-chip system 4102 is coupled to the display controller 4128 and the touch screen controller 4130. PCD 4000 may further include a video encoder 4134, e.g., a phase-alternating line ("PAL") encoder, a sequential couleur avec memoire ("SECAM") encoder, a national television system(s) committee ("NTSC") encoder or any other type of video encoder 4134. The video encoder 4134 is coupled to the multi-core CPU 4110. A video amplifier 4136 is coupled to the video encoder 4134 and the touch screen display 4132. A video port 4138 is coupled to the video amplifier 4136. A universal serial bus ("USB") controller 4140 is coupled to the CPU 4110. Also, a USB port 4142 is coupled to the USB controller 4140. A memory 4112, which may include a PoP memory, a cache 4116, a mask ROM/Boot ROM, a boot OTP memory, a DDR memory 4115 may also be coupled to the CPU 4110. A subscriber identity module ("SIM") card 4146 may also be coupled to the CPU 4110. Further, as shown in FIG. 24, a digital camera 4148 may be coupled to the CPU 4110. In an exemplary aspect, the digital camera 4148 is a charge-coupled device ("CCD") camera or a complementary metal-oxide semiconductor ("CMOS") camera.

As further illustrated in FIG. 24, a stereo audio CODEC 4150 may be coupled to the analog signal processor 4126. Moreover, an audio amplifier 4152 may be coupled to the stereo audio CODEC 4150. In an exemplary aspect, a first stereo speaker 4154 and a second stereo speaker 4156 are coupled to the audio amplifier 4152. FIG. 24 shows that a microphone amplifier 4158 may be also coupled to the stereo audio CODEC 4150. Additionally, a microphone 4160 may be coupled to the microphone amplifier 4158. In a particular aspect, a frequency modulation ("FM") radio tuner 4162 may be coupled to the stereo audio CODEC 4150. Also, an FM antenna 4164 is coupled to the FM radio tuner 4162. Further, stereo headphones 4166 may be coupled to the stereo audio CODEC 4150.

FIG. 24 further indicates that a radio frequency ("RF") transceiver 4168 may be coupled to the analog signal processor 4126. An RF switch 4170 may be coupled to the RF transceiver 4168 and an RF antenna 4172. A keypad 4174 may be coupled to the analog signal processor 4126. Also, a mono headset with a microphone 4176 may be coupled to the analog signal processor 4126. Further, a vibrator device 4178 may be coupled to the analog signal processor 4126. FIG. 24 also shows that a power supply 4188, for example a battery, is coupled to the onchip system 4102 through a power management integrated circuit ("PMIC") 4180. In a particular aspect, the power supply 4188 includes a rechargeable DC battery or a DC power supply that is derived from an alternating current ("AC") to DC transformer that is connected to an AC power source. In another particular aspect, the power supply 4188 includes a kinetically rechargeable DC battery.

The CPU 4110 may also be coupled to one or more internal, on-chip thermal sensors 4157A as well as one or more external, off-chip thermal sensors 4157B and physiological sensors 4159. The on-chip thermal sensors 4157A may comprise one or more proportional to absolute temperature ("PTAT") temperature sensors that are based on vertical PNP structure and are usually dedicated to complementary metal oxide semiconductor ("CMOS") very large-scale integration ("VLSI") circuits. The off-chip thermal sensors 4157B may comprise one or more thermistors. The thermal sensors 4157 may produce a voltage drop that is converted to digital signals with an analog-to-digital converter ("ADC") controller (not shown).

The touch screen display 4132, the video port 4138, the USB port 4142, the camera 4148, the first stereo speaker 4154, the second stereo speaker 4156, the microphone 4160, the FM antenna 4164, the stereo headphones 4166, the RF switch 4170, the RF antenna 4172, the keypad 4174, the mono headset 4176, the vibrator 4178, thermal sensors 4157B, other sensors 4159, the PMIC 4180 and the power supply 4188 are external to the on-chip system 4102. It will be understood, however, that one or more of these devices depicted as external to the on-chip system 4102 in the exemplary embodiment of a PCD 4000 in FIG. 24 may reside on chip 4102 in other exemplary embodiments.

In a particular aspect, one or more of the method steps described herein may be implemented by executable instructions and parameters stored in the memory 4112 or vehicle infotainment (VI) module 4101. Further, the VI module 4101, the memory 4112, the instructions stored therein, or a combination thereof may serve as a means for performing one or more of the method steps described herein.

Figure 25:
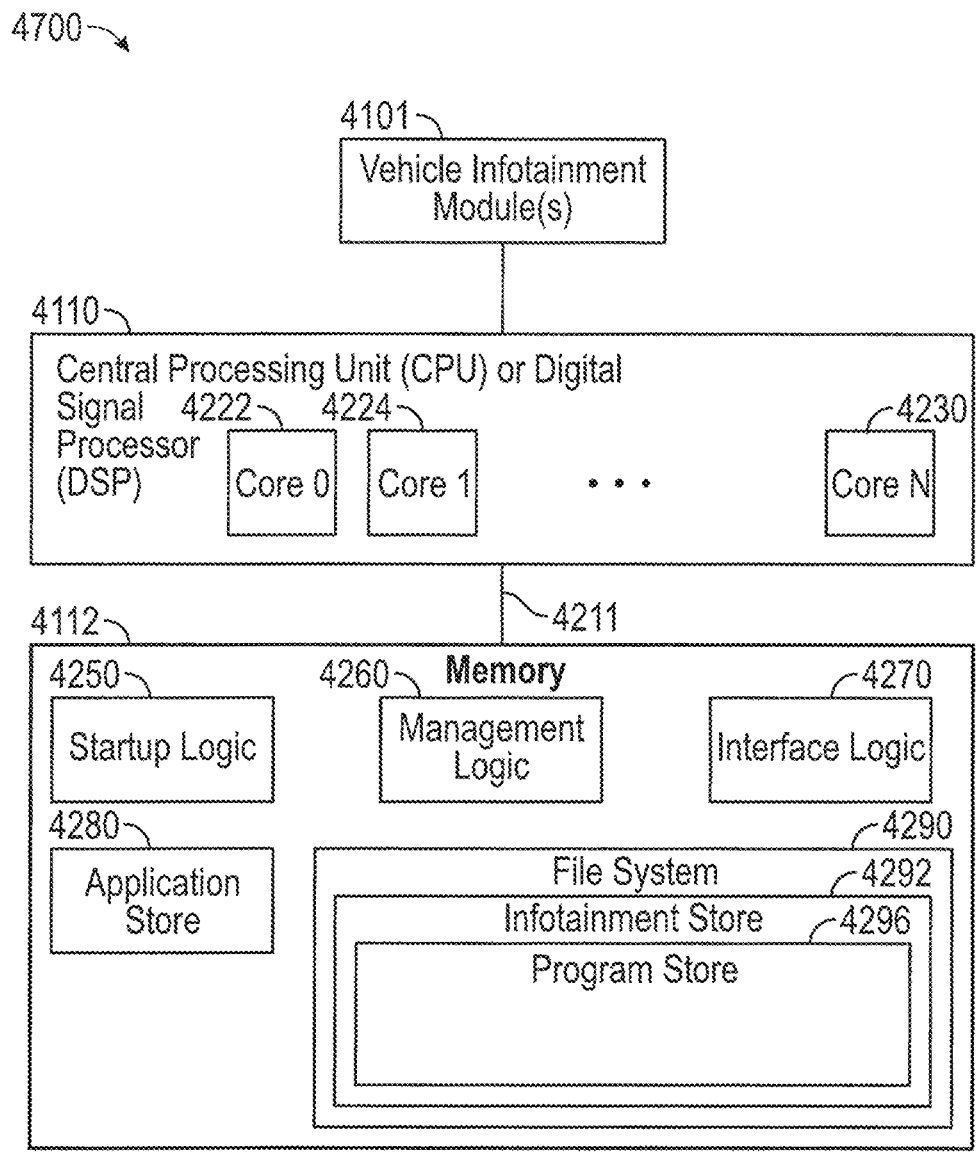
FIG. 25 is a schematic of a smartphone/tablet software structure.

FIG. 25 is a schematic diagram illustrating an exemplary software architecture 4700 for the described embodiments. As illustrated in FIG. 25, the CPU or digital signal processor 4110 is coupled to the memory 4112 via main bus 4211. The memory 4112 may reside within a hub component 4100, a sensor package 4125 or a combination thereof.

The CPU 4110, as noted above, is a multiple-core processor having N core processors. That is, the CPU 4110 includes a first core 4222, a second core 4224, and an Nth core 4230. As is known to one of ordinary skill in the art, each of the first core 4222, the second core 4224 and the Nth core 4230 are available for supporting a dedicated application or program. Alternatively, one or more applications or programs may be distributed for processing across two or more of the available cores.

The CPU 4110 may receive commands from the VI module(s) 4101 that may comprise software and/or hardware. If embodied as software, the module(s) 4101 comprise instructions that are executed by the CPU 4110 that issues commands to other application programs being executed by the CPU 4110 and other processors.

The first core 4222, the second core 4224 through to the Nth core 4230 of the CPU 4110 may be integrated on a single integrated circuit die, or they may be integrated or coupled on separate dies in a multiple-circuit package.

Designers may couple the first core 4222, the second core 4224 through to the Nth core 4230 via one or more shared caches and they may implement message or instruction passing via network topologies such as bus, ring, mesh and crossbar topologies.

When the logic used by the PCD 4000 is implemented in software, as is shown in FIG. 25, it should be noted that one or more of startup logic 4250, management logic 4260, VI interface logic 4270, applications in application store 4280 and portions of the file system 4290 may be stored on any computer-readable medium for use by, or in connection with, any computer-related system or method. In the context of this document, a computer-readable medium is an electronic, magnetic, optical, or other physical device or means that can contain or store a computer program and data for use by or in connection with a computer-related system or method. The various logic elements and data stores may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random-access memory (RAM) (electronic), a read-only memory (ROM) (electronic), an erasable programmable read-only memory (EPROM, EEPROM, or Flash memory) (electronic), an optical fiber (optical), Flash, and a portable compact disc read-only memory (CDROM) (optical). Note that the computer-readable medium could even be paper or another suitable medium upon which the program is printed, as the program can be electronically captured, for instance via optical scanning of the paper or other medium, then compiled, interpreted or otherwise processed in a suitable manner if necessary, and then stored in a computer memory.

In an alternative embodiment, where one or more of the startup logic 4250, management logic 4260 and perhaps the VI interface logic 4270 are implemented in hardware, the various logic may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The memory 4112 is a non-volatile data storage device such as a flash memory or a solid-state memory device. Although depicted as a single device, the memory 4112 may be a distributed memory device with separate data stores coupled to the digital signal processor 4110 (or additional processor cores).

The startup logic 4250 includes one or more executable instructions for selectively identifying, loading, and executing a select program for executing and/or supporting the operation of a vehicle infotainment system. The startup logic 4250 may identify, load and execute a select VI program. An exemplary select program may be found in the program store 4296 of the embedded file system 4290. The exemplary select program, when executed by one or more of the core processors in the CPU 4110 may operate in accordance with one or more signals provided by the VI module 4101.

The management logic 4260 includes one or more executable instructions for terminating a CTM program on one or more of the respective processor cores, as well as selectively identifying, loading, and executing a more suitable replacement program. The management logic 4260 is arranged to perform these functions at run time or while the PCD 4100 is powered and in use by an operator of the device. A replacement program, which may be customized by a user in some CTM embodiments, may be found in the program store 4296 of the embedded file system 4290.

The interface logic 4270 includes one or more executable instructions for presenting, managing and interacting with external inputs to observe, configure, or otherwise update information stored in the embedded file system 4290. In one embodiment, the interface logic 4270 may operate in conjunction with manufacturer inputs received via the USB port 4142. These inputs may include one or more programs to be deleted from or added to the program store 4296. Alternatively, the inputs may include edits or changes to one or more of the programs in the program store 4296. Moreover, the inputs may identify one or more changes to, or entire replacements of one or both of the startup logic 4250 and the management logic 4260. By way of example, the inputs may include a change to the weight of parameters used to generate a customized fitness factor.

The interface logic 4270 enables a manufacturer to controllably configure and adjust an end user's experience under defined operating conditions on the PCD 4000. When the memory 4112 is a flash memory, one or more of the startup logic 4250, the management logic 4260, the interface logic 4270, the application programs in the application store 4280 or information in the embedded file system 4290 may be edited, replaced, or otherwise modified. In some embodiments, the interface logic 4270 may permit an end user or operator of the PCD 4000 to search, locate, modify or replace the startup logic 4250, the management logic 4260, applications in the application store 280 and information in the embedded file system 4290. The operator may use the resulting interface to make changes that will be implemented upon the next startup of the PCD 4000. Alternatively, the operator may use the resulting interface to make changes that are implemented during run time.

The embedded file system 4290 includes a hierarchically arranged fitness factor store 4292. In this regard, the file system 4290 may include a reserved section of its total file system capacity for the storage of information for the configuration and management of the various fitness factor and/or CTM algorithms used by the PCD 4000.

Figure 26:
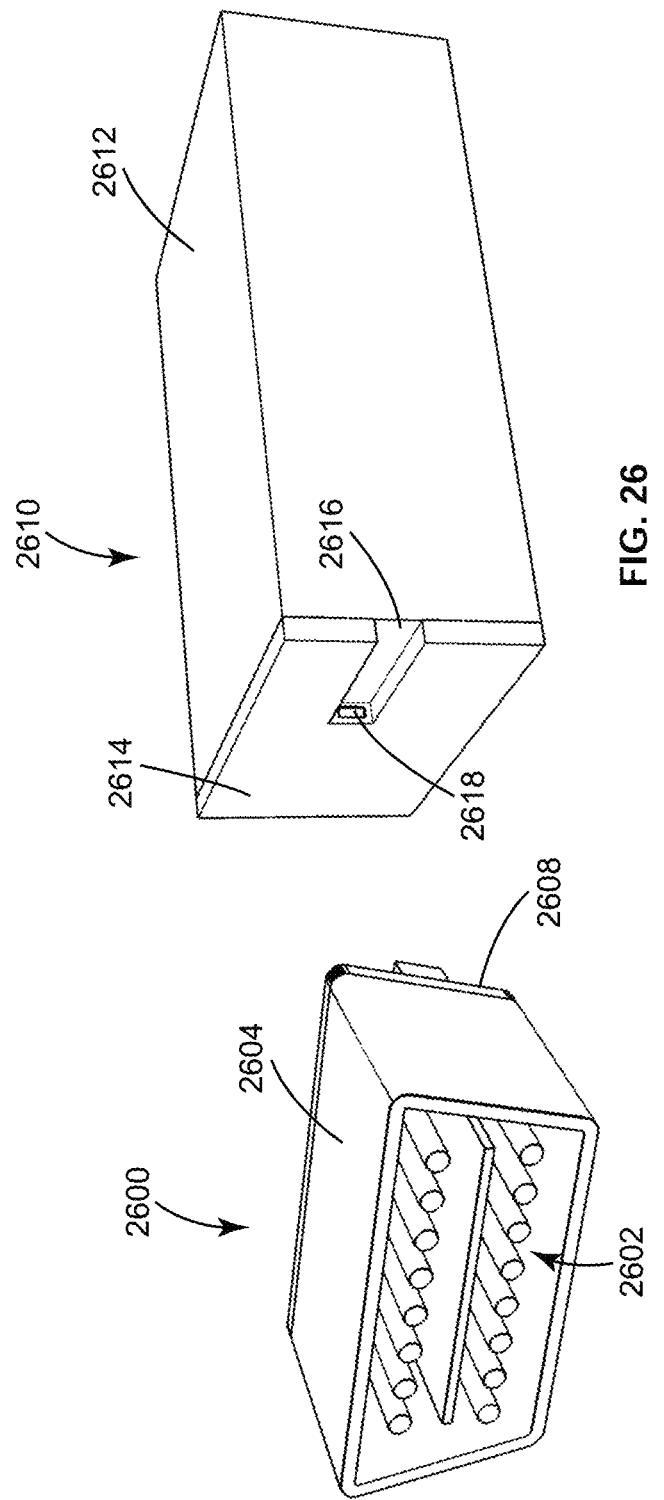
FIG. 26 is an isometric view of an OBD module including an interface module with a tongue and a micro-connector and a transceiver module with a recess and a receiver to receive the tongue and micro-connector.
Figure 27:
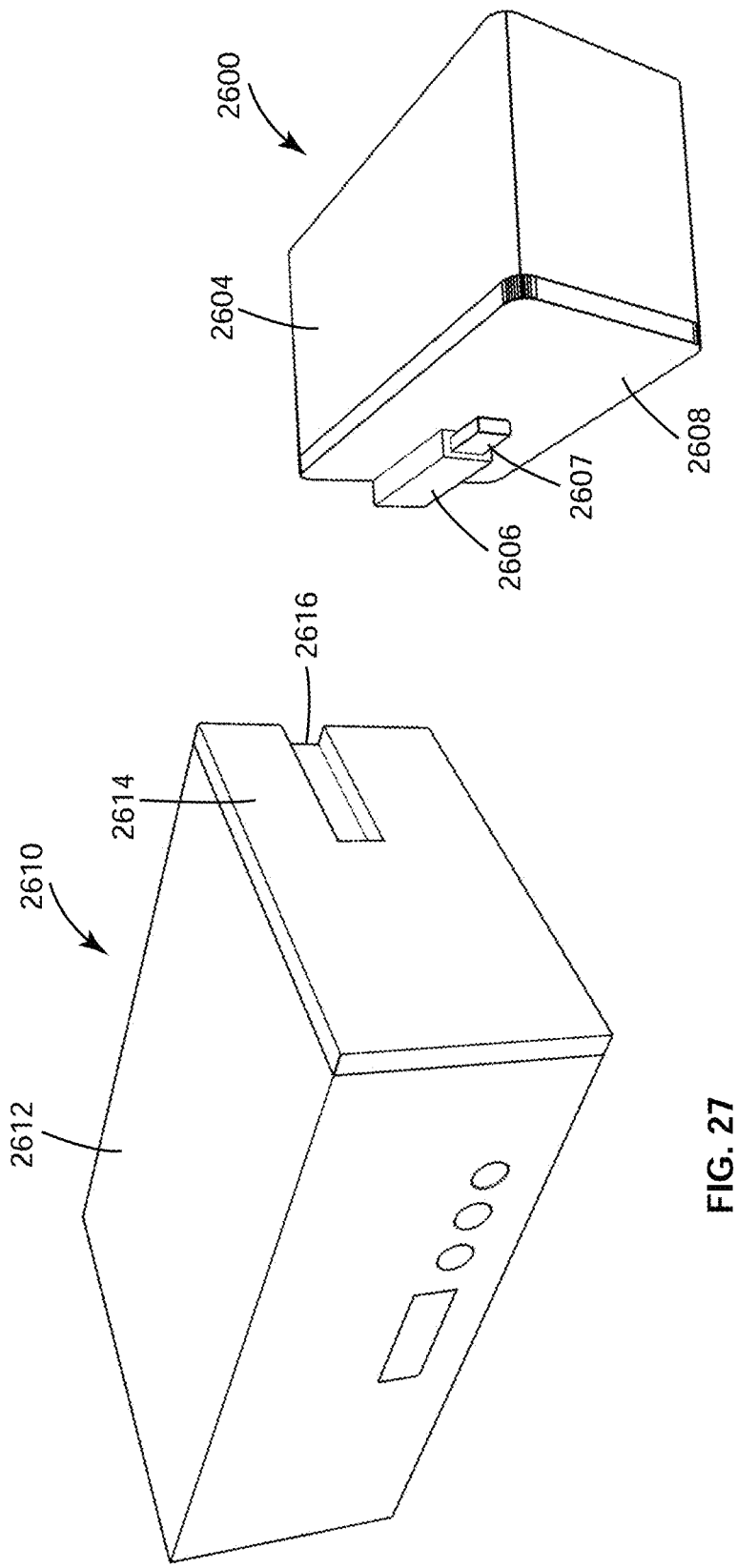
FIG. 27 is a second isometric view of the interface module with a tongue and a transceiver module with a recess to receive the tongue.
Figure 28:
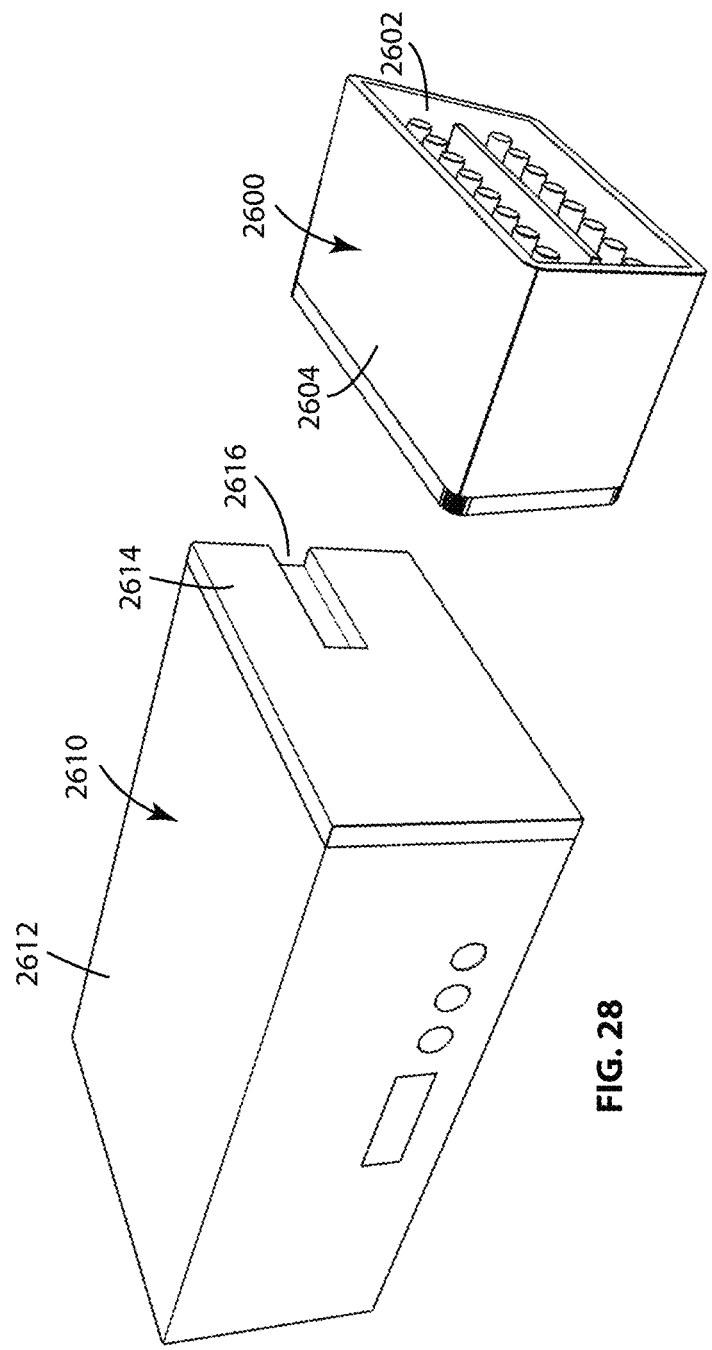
FIG. 28 is a third isometric view of an interface module with a tongue and a transceiver module with a recess to receive the tongue.
Figure 29:
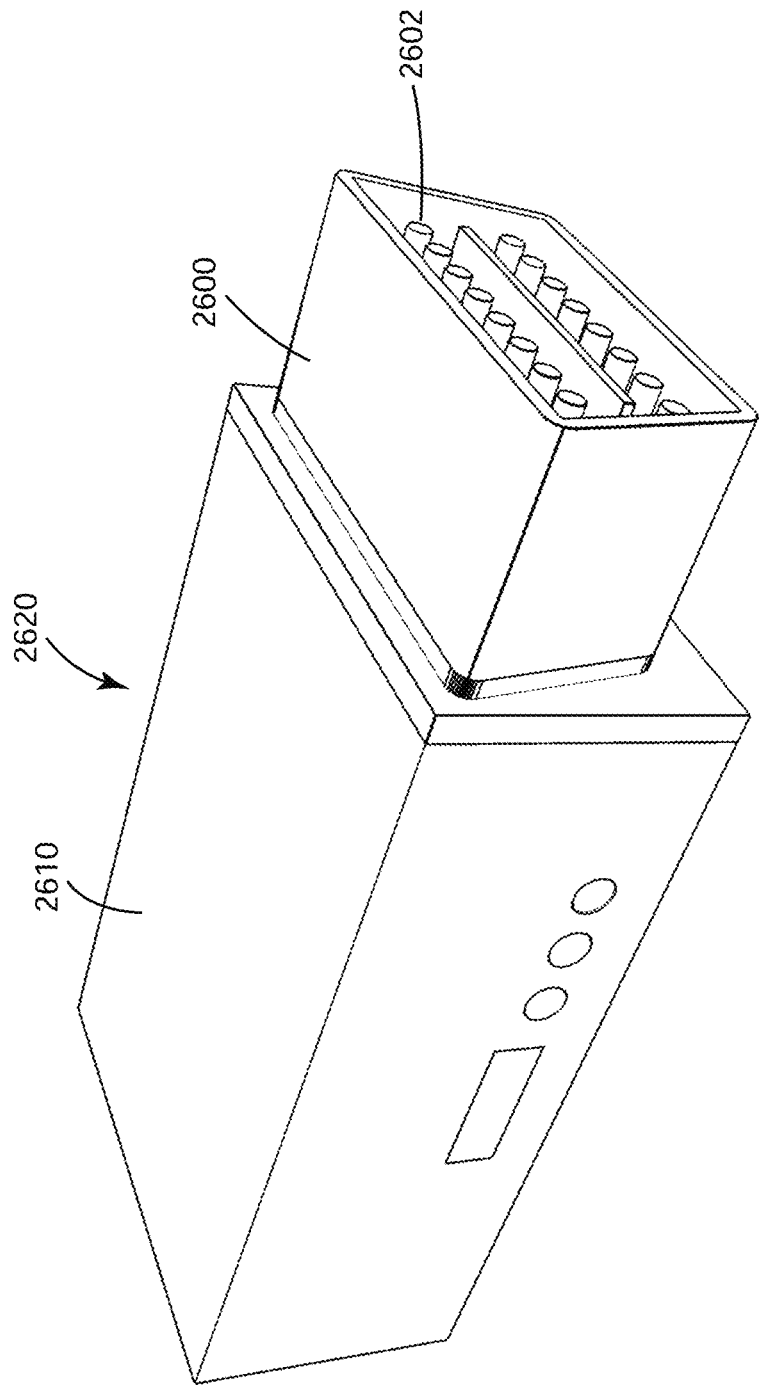
FIG. 29 is an isometric view of the interface module and transceiver module fitted together to form the completed OBD module.

In another embodiment, and with reference to FIG. 26, FIG. 27, FIG. 28, and FIG. 29, the OBD module 2620 can be formed from an interface module 2600 and a transceiver module 2610 that are formed as separate components and electrically connected to each other. The interface module 2600 includes a body 2604 with OBD connector pin array 2602 and, included on opposite wall 2608, tongue 2606. Transceiver module 2610 includes body 2612 and sidewall 2614 that defines recess 2616. The female connector recess 2616 is shaped and sized to slidably and reversibly receive the male portion/tongue 2606 and such that male connector 2607 (FIG. 27) may be reversibly inserted into female connector 2618 (FIG. 26). When connected, power, data and other electrical signals can be communicated between the interface module 2600 and the transceiver module 2610. The transceiver module 2610 shown in the embodiment of FIGS. 26-29 includes the controller, RF transceiver and the relevant operating components while the interface module 2600 will include the components necessary to interface with the vehicle OBD port. In this way, the OBD module 2620 may be constructed from the joined combination of the interface module 2600 and the transceiver module 2610.

In another embodiment, a recess/female connector may be on wall 2608 of the interface module 2600 and the male portion/tongue may be place on sidewall 2614 of the transceiver module 2610. In this manner, female connector 2618 and male connector 2607 may be switched. In another embodiment, the separate interface module 2600 and transceiver module 2610 may be electrically and mechanically connected by equivalent means known to or could be known to a person of ordinary skill in the art.

Figure 30:
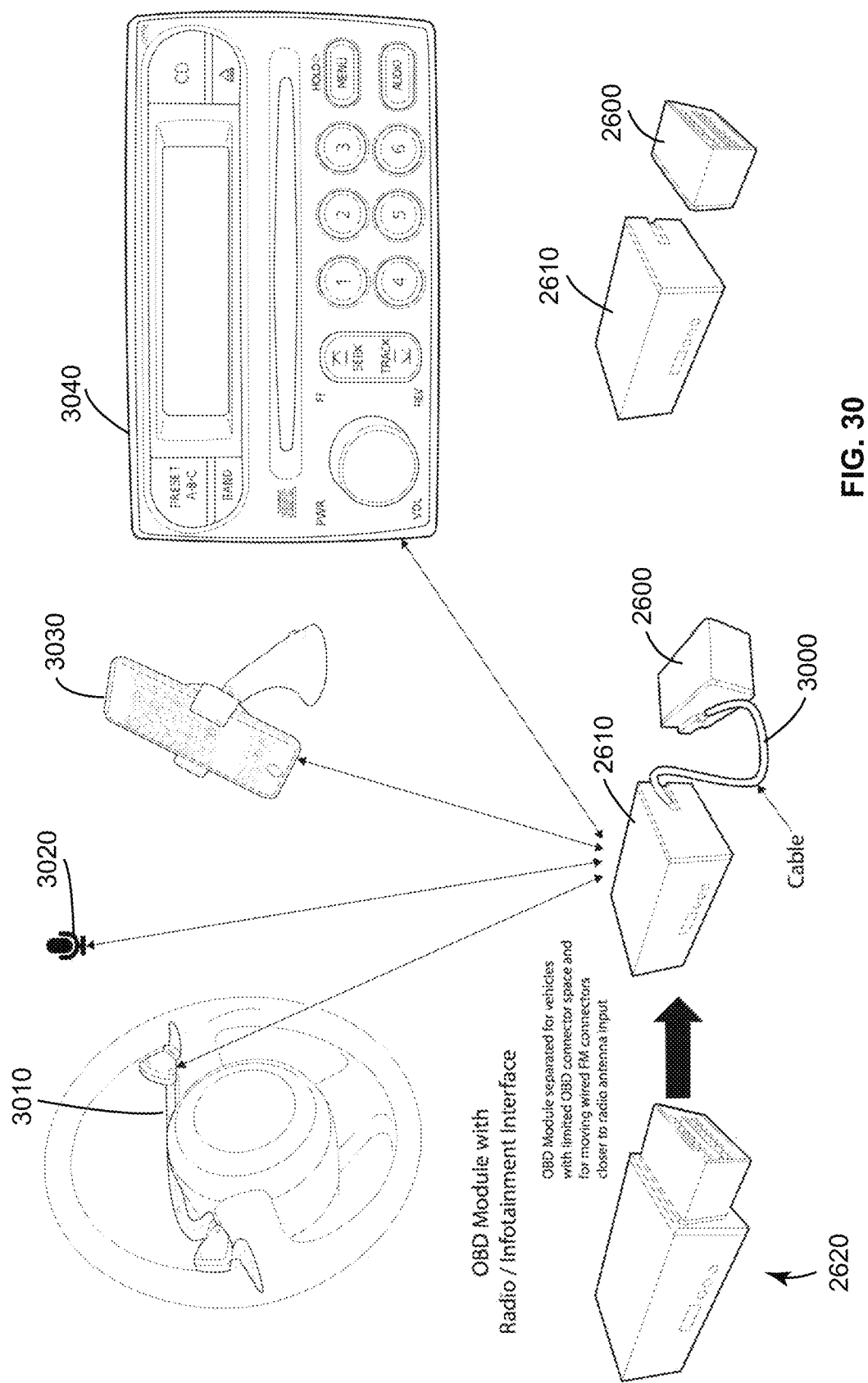
FIG. 30 is a schematic view of the electronic communication between the OBD module of FIG. 26 and the radio/infotainment system, a microphone, a smartphone, and a steering wheel control and the wired connection between the interface module and the transceiver module.

In another embodiment, the separated interface module 2600 and transceiver module 2610 may be electronically and operatively connected via cable 3000, such as shown in FIG. 30. In this manner the interface module 2600 may be operatively connected to an OBD port in the vehicle, and if there is insufficient space to directly connect the transceiver module 2610 in the location near the OBD port in the vehicle, cable 3000 allows the transceiver module 2610 to be located elsewhere in the vehicle. The cable 3000 may be of any length needed for a person of ordinary skill in the art to connect the components. FIG. 30 also depicts the interface module 2610 in wireless communication with steering wheel module 3010, microphone 3020, smartphone/tablet 3030 and radio infotainment system 3040. Wired communication between the transceiver module 2610 and the interface module 2600 is an alternative embodiment to wireless communication in FIG. 30. In such an embodiment, the transceiver module 2610 would need a separate power supply since it would not receive power from the vehicle OBD port.

Figure 31:
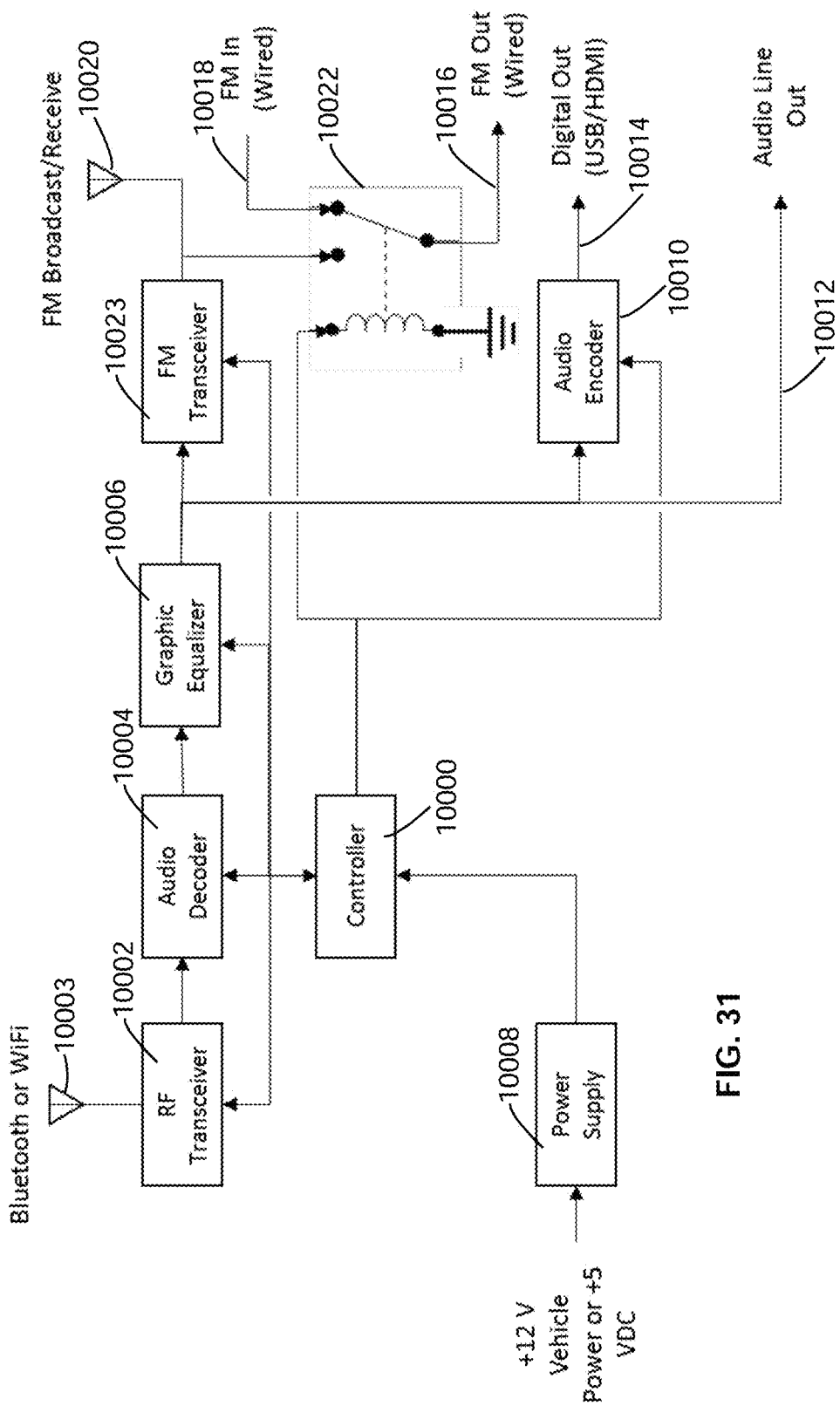
FIG. 31 is a schematic of a radio/infotainment module with a graphic equalizer module.

In another embodiment, FIG. 31 is a functional block diagram illustrating an exemplary, non-limiting aspect of a radio/infotainment interface module ("RIIM") for implementing the described systems and methods. The controller/processor 10000 may embody one or more CPU modules 5102 as described in FIG. 15C. Controller/processor 10000 is connected to RF transceiver 10002 module. The RF transceiver 10002 may include an FM transceiver antenna 10003. Controller 10000 is also connected to audio decoder 10004 that is also in communication with RF transceiver 10002 and a dedicated graphic equalizer 10006. Controller 10000 is also in communication with FM transceiver 10023. FM transceiver 10020 is also connected to relay contacts 10022 and antenna 10020. The controller 10000 is in communication with relay 10022. The position of the relay 10022 is controlled by the controller 10000. The controller 10000 can selectively move relay contacts to direct either the FM transceiver 10023 output or the FM In (Wired) signal 10018 onto FM Out (Wired) 10016. The controller 10000 is connected to coil 10026 and which is in turn connected to ground 10024, and receives power from OBD module or from an independent power source 10008. The controller 10008 also controls an audio encoder 10010 that receives signals from equalizer 10006 and transmits digital signals along the digital output line 10014. The equalizer 10006 may also transmit an audio signal out directly through audio line 10012. The output signal along lines 10012 and 10014 is the received signal from the RF transceiver 10002 that is transformed by the graphic equalizer 10006, which can be controlled by a user through a smart device, as described in further detail below.

Figure 32:
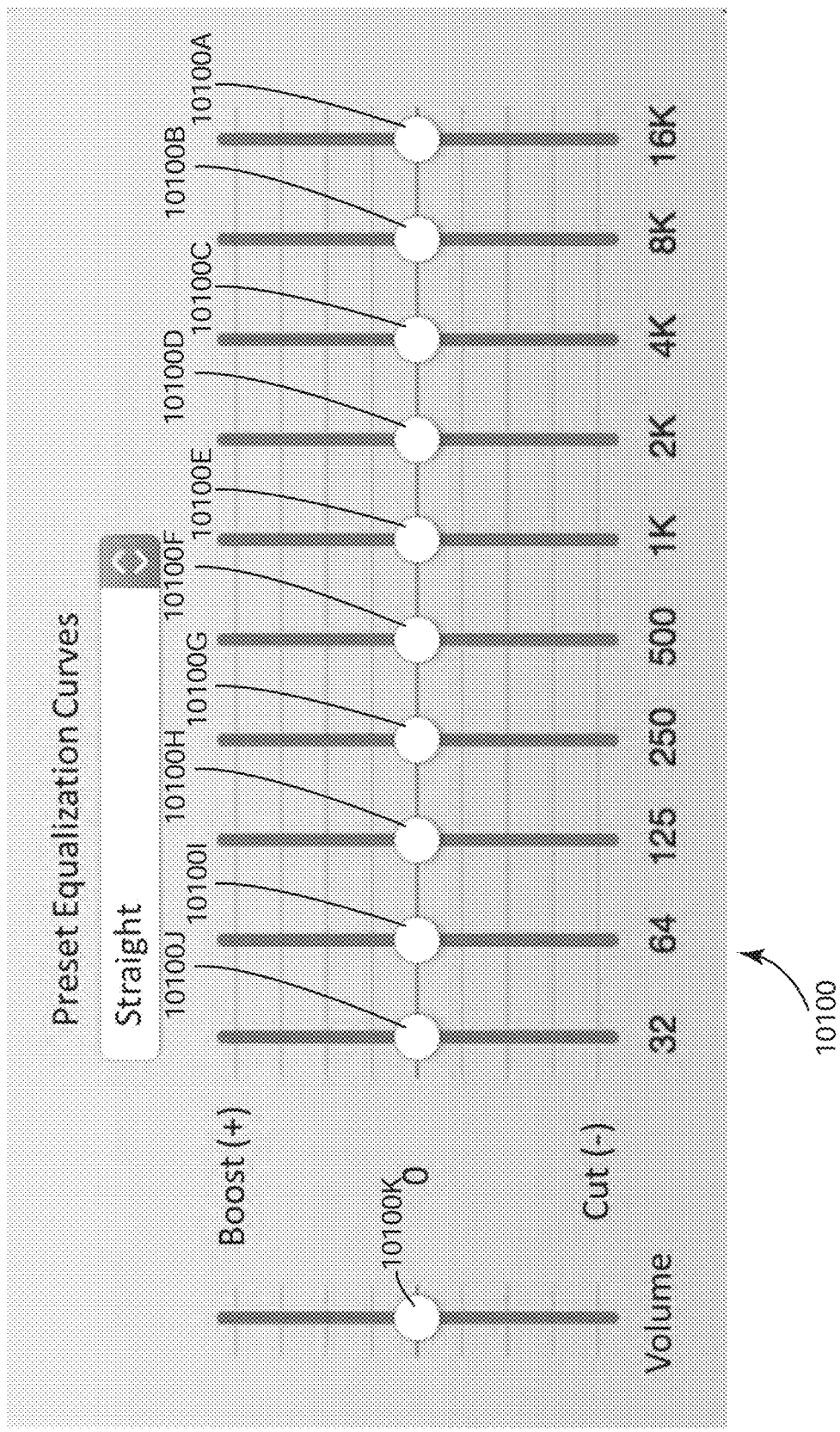
FIG. 32 is a representation of a smartphone application to provide a user interface with a graphic equalizer module in a radio/infotainment device.

FIG. 32 provides a graphic representation 10100 of how the graphic equalizer 10006 may be controlled on a smartphone. Each button 10100A-K may be individually controlled by fingerswipe on the screen of a smartphone in vertical manner to control output at the frequencies indicated. The graphic equalizer 10006 thus allows the user to modify the received signal from the RF transceiver 10002 prior to play back on the radio/infotainment system of the vehicle without any modifications to the vehicle.

In another embodiment, the present disclosure provides a method of selectively interrupting a video/audio stream from a smartphone to the radio/infotainment system as the video/audio stream is transmitted through the radio/infotainment interface. For example, and with respect to FIG. 33, process 10200 shows an algorithm for use by radio/infotainment module. Radio/infotainment module could receive a stream of audio, as normal, but then receive a request for a substitute message from a server linked to module. This substitute message could be a paid advertisement, information message or any other message that interrupts the current stream of audio. In decision step 10201, the substitute message is received and accessed. Once received, the smartphone playback is paused in step 10202. After the smartphone playback is paused, the substitute message is transmitted through the module 13/93/952/2610 to the radio/infotainment system as shown in step 10203. The substitute message is played and, after completion, the smartphone stream is restarted in step 10204. The process/method would start upon a request from a server or other linked module.

Systems, devices and methods have been described using detailed descriptions of embodiments thereof that are provided by way of example and are not intended to limit the scope of the disclosure. The described embodiments comprise different features, not all of which are required in all embodiments of an OBD Module, Infotainment interface or combinations thereof. Some embodiments of an OBD Module, Infotainment interface or combinations thereof utilize only some of the features or possible combinations of the features. Variations of embodiments of an OBD Module, Infotainment interface or combinations thereof that are described and embodiments of a an OBD Module, Infotainment interface or combinations thereof comprising different combinations of features noted in the described embodiments will occur to persons of the art.

It will be appreciated by persons skilled in the art that systems, devices and methods for the provision of an OBD Module, Infotainment interface or combinations thereof is not limited by what has been particularly shown and described herein above. Rather, the scope of systems, devices and methods for the provision of an OBD Module, Infotainment interface or combinations thereof is defined by the claims that follow.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the drawings, which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer readable media.

Therefore, although selected aspects have been illustrated and described in detail, it will be understood that various substitutions and alterations may be made therein without departing from the spirit and scope of the present invention, as defined by the following claims.

What is claimed is:

1. An on-board diagnostics (OBD) module for use with a vehicle including a vehicle data port and a vehicle radio/infotainment system, comprising:
   a controller;
   an interface module including a first housing and a data bus interface connector configured to connect to the vehicle data port to draw power from the vehicle data port; and
   a transceiver module including a second housing that surrounds the controller and operable to communicate by radio frequency between the controller and a mobile device and to communicate directly between the controller and the vehicle radio/infotainment system separate from the vehicle data port, wherein the mobile device communicates to stream audio from the mobile device to the vehicle radio/infotainment system through the transceiver and controller separate from the vehicle data ports, wherein the first housing of the interface module and the second housing of the transceiver module are formed as separate components in communication with each other.

2. The OBD module of claim 1 wherein the first housing of the interface module includes a first connector and the second housing of the transceiver module includes a second connector, wherein the first and second connectors mate with each other to physically connect the first housing of the interface module to the second housing of the transceiver module.

3. The OBD module of claim 2 wherein the first connector is a tongue and the second connector is a recess, wherein the recess is configured to receive the tongue.

4. The OBD module of claim 2 wherein the first connector is a recess and the second connector is a tongue, wherein the recess is configured to receive the tongue.

5. The OBD module of claim 1, further comprising a cable extending between the interface module and the transceiver module.

6. The OBD module of claim 1 further comprising a steering wheel mountable system control module in electronic communication with the OBD module, wherein the system control module is configured for mounting to a steering wheel of the vehicle.

* * * * *